(12) United States Patent
Pappas et al.

(10) Patent No.: US 11,574,586 B1
(45) Date of Patent: Feb. 7, 2023

(54) HYBRID IGZO PIXEL ARCHITECTURE

(71) Applicant: Meta Platforms Technologies, LLC, Menlo Park, CA (US)

(72) Inventors: Ilias Pappas, Cork (IE); Daniel Henry Morris, Mountain View, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/718,060

(22) Filed: Apr. 11, 2022

(30) Foreign Application Priority Data

Oct. 14, 2021 (GR) .............................. 20210100700

(51) Int. Cl.
| | |
|---|---|
| *G09G 3/32* | (2016.01) |
| *H03K 3/037* | (2006.01) |
| *G02B 27/01* | (2006.01) |
| *H01L 27/15* | (2006.01) |
| *G09G 3/00* | (2006.01) |

(52) U.S. Cl.
CPC ........... *G09G 3/32* (2013.01); *G02B 27/0172* (2013.01); *H01L 27/156* (2013.01); *H03K 3/037* (2013.01); *G02B 2027/0112* (2013.01); *G09G 3/002* (2013.01); *G09G 2300/0842* (2013.01); *G09G 2300/0871* (2013.01); *G09G 2310/0251* (2013.01); *G09G 2320/0233* (2013.01); *G09G 2320/0242* (2013.01); *G09G 2320/0693* (2013.01); *G09G 2330/021* (2013.01); *G09G 2330/12* (2013.01)

(58) Field of Classification Search
CPC .. G09G 3/32; G09G 3/002; G09G 2300/0842; G09G 2300/0871; G09G 2310/0251; G09G 2320/0233; G09G 2320/0242; G09G 2320/0693; G09G 2330/021; G09G 2330/12; G02B 27/0172; G02B 2027/0112; H01L 27/156; H03K 3/037
See application file for complete search history.

(56) References Cited

U.S. PATENT DOCUMENTS

| | | | |
|---|---|---|---|
| 11,170,719 B1* | 11/2021 | Lu | ........................ H01L 27/3262 |
| 2020/0005710 A1* | 1/2020 | Miyata | .................. G09G 3/3233 |
| 2020/0075769 A1* | 3/2020 | Yamazaki | ........... H01L 29/7869 |

(Continued)

*Primary Examiner* — Andrew Sasinowski
(74) *Attorney, Agent, or Firm* — Weaver Austin Villeneuve & Sampson LLP

(57) ABSTRACT

A display device includes a silicon wafer including digital circuits, a micro-light emitting diode (micro-LED) wafer including an array of micro-LEDs, and an indium-gallium-zinc-oxide (IGZO) layer between the silicon wafer and the micro-LED wafer and including analog circuits. The digital circuits are characterized by a first operating supply voltage and are configured to generate digital control signals based on digital display data of an image frame. The analog circuits are characterized by a second operating supply voltage higher than the first operating supply voltage. The analog circuits includes analog storage devices configured to storing analog signals, and transistors controlled by the digital control signals and the analog signals to generate drive currents for driving the array of micro-LEDs. The digital circuits on the silicon wafer or the analog circuits in the IGZO layer include level-shifting circuits at interfaces between the digital circuits and the analog circuits.

20 Claims, 25 Drawing Sheets

(56) References Cited

U.S. PATENT DOCUMENTS

2020/0135092 A1* 4/2020 Ahmed .................... G09G 3/32
2021/0142735 A1* 5/2021 Cho ..................... G09G 3/3233
2021/0202568 A1* 7/2021 Kim .................... H01L 27/3262

* cited by examiner

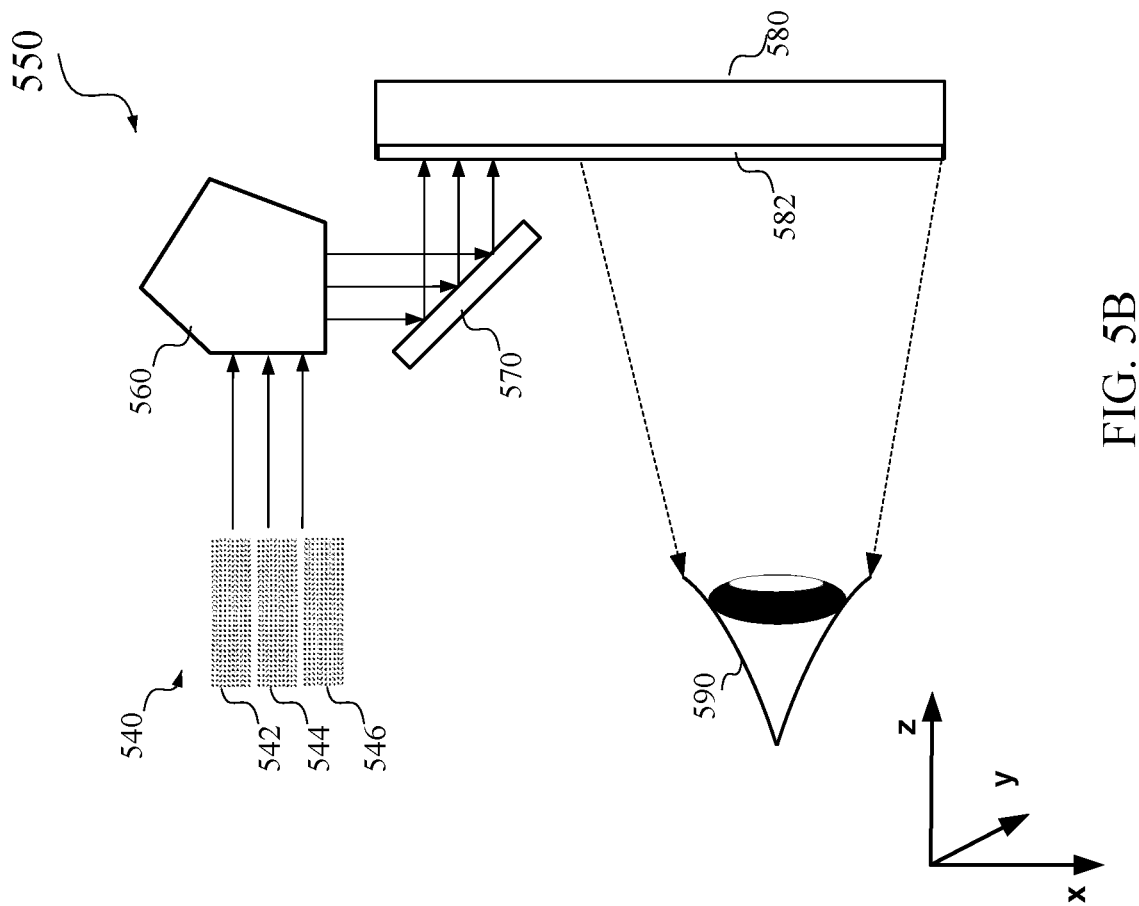
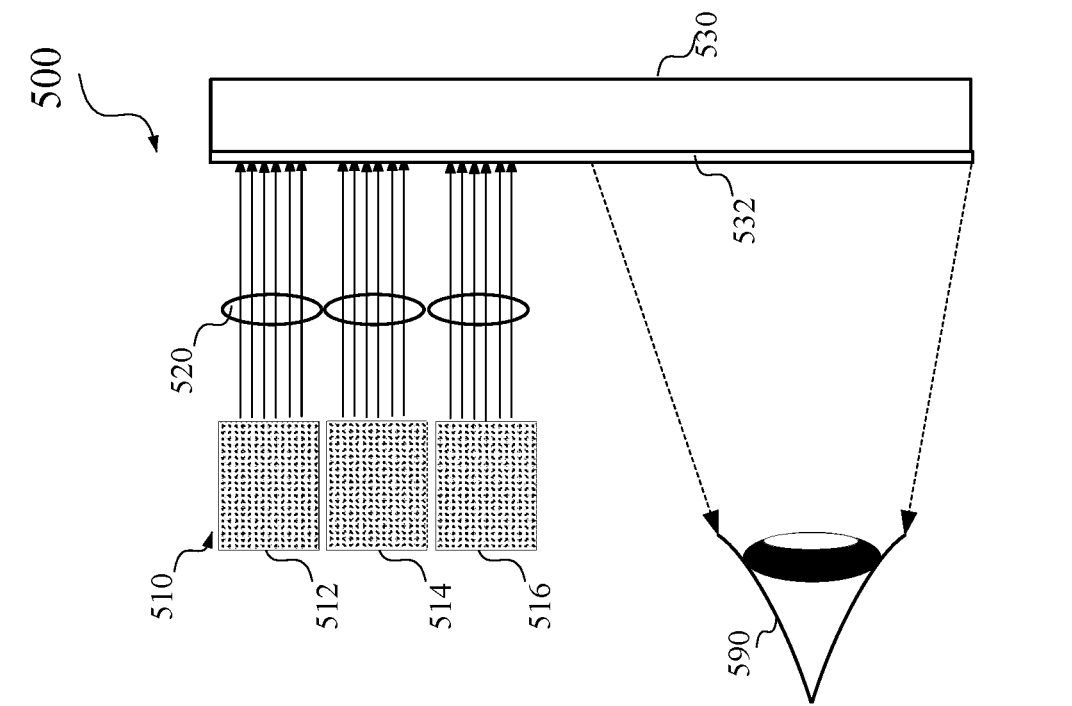
FIG. 5B
FIG. 5A

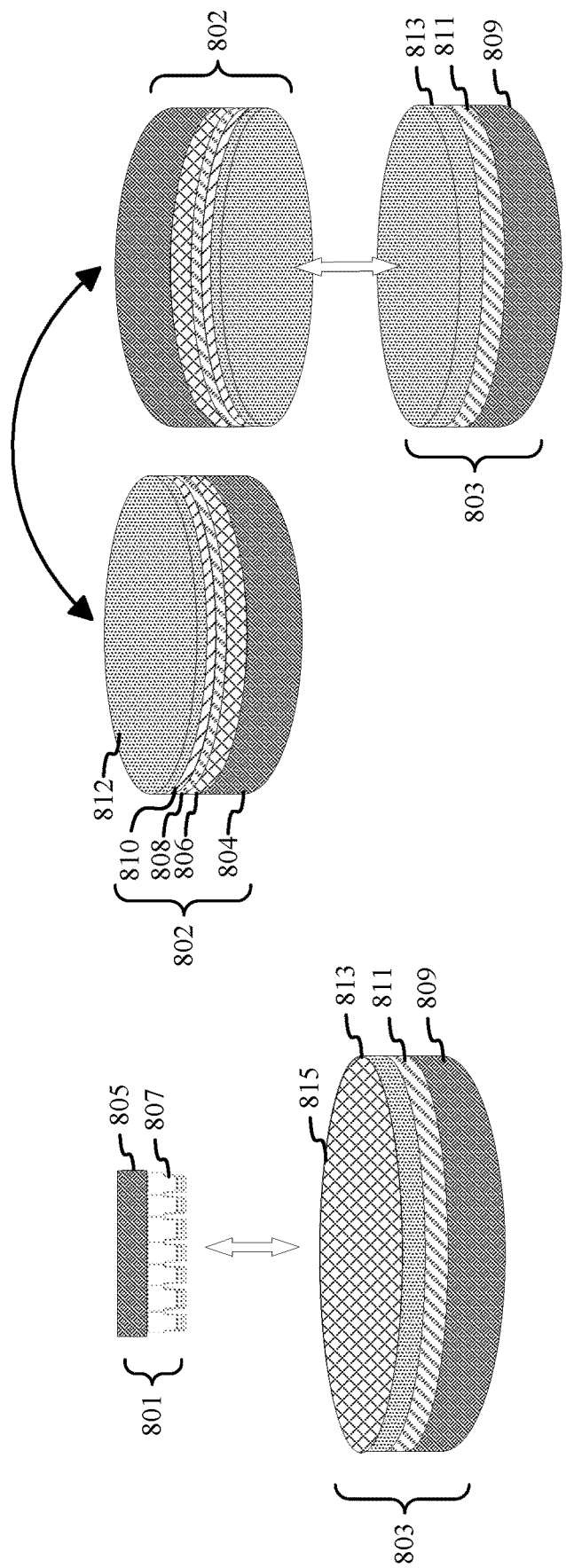

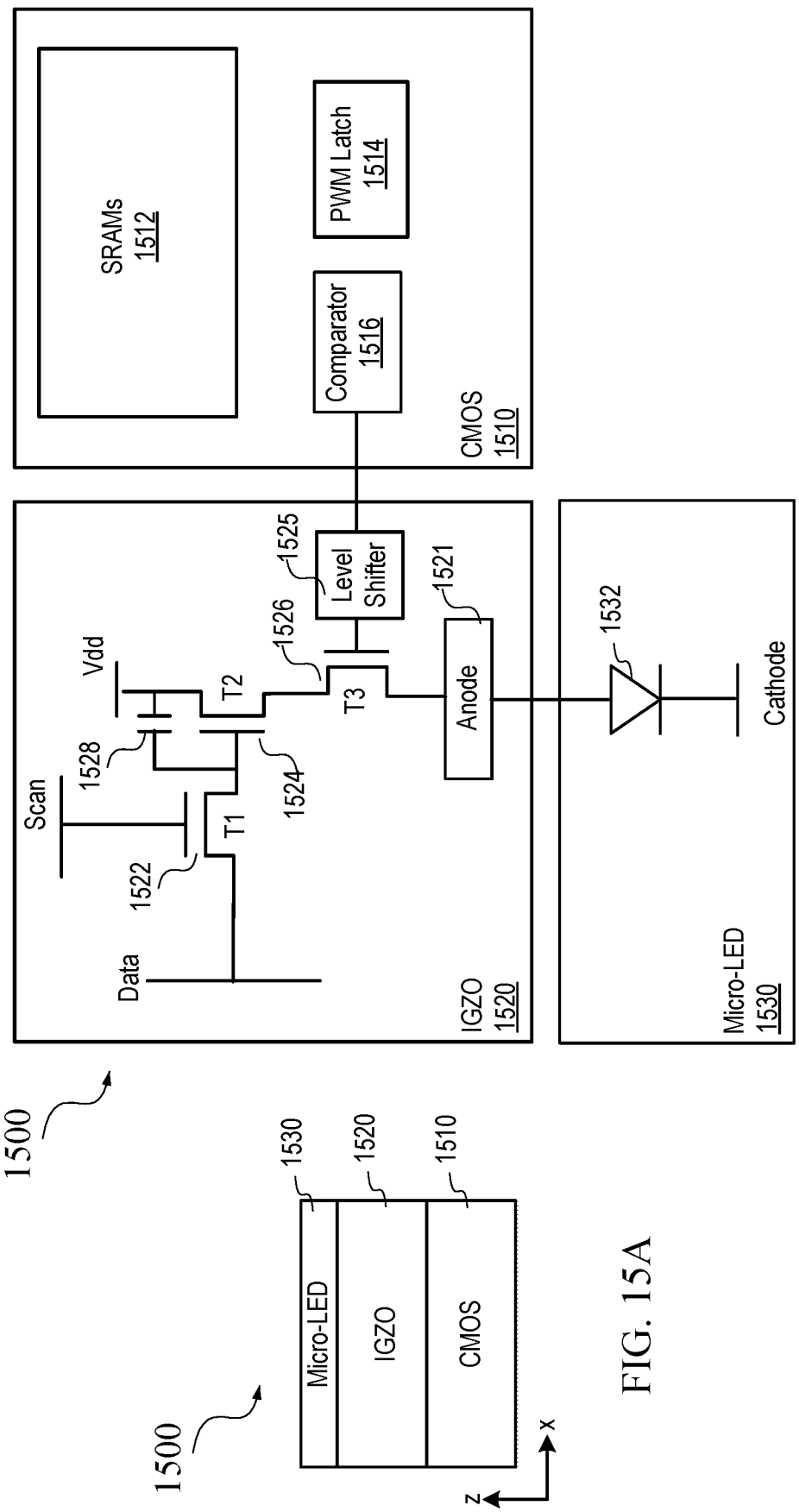

US 11,574,586 B1

HYBRID IGZO PIXEL ARCHITECTURE

CROSS-REFERENCE TO RELATED APPLICATION

This application claims the benefit of and priority to Greek Application No. 20210100700, filed Oct. 14, 2021, entitled "HYBRID IGZO PIXEL ARCHITECTURE," which is assigned to the assignee hereof, and is herein incorporated by reference in its entirety for all purposes.

BACKGROUND

An artificial reality system, such as a head-mounted display (HMD) or heads-up display (HUD) system, generally includes a near-eye display system in the form of a headset or a pair of glasses. The artificial reality system may be configured to present content to a user via an electronic or optic display within, for example, about 10 to 20 mm in front of the user's eyes. The near-eye display system may display virtual objects or combine images of real objects with virtual objects, as in virtual reality (VR), augmented reality (AR), or mixed reality (MR) applications. For example, in an AR system, a user may view images of virtual objects (e.g., computer-generated images (CGIs)) and the surrounding environment, for example, by seeing through transparent display glasses or lenses or by viewing displayed images of the surrounding environment captured by a camera. The near-eye display system may include one or more light sources that are driven to output light at various luminance levels to display the images.

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs based on III-V semiconductors, such as alloys of AlN, GaN, InN, AlGaInP, other quaternary phosphide compositions, and the like, have begun to be developed for various display applications due to their small size (e.g., with a linear dimension less than 100 µm, less than 50 µm, less than 10 µm, less than 5 µm, less than 3 µm, or less than 2 µm), high packing density (and hence higher resolution), and high brightness. For example, micro-LEDs that emit light of different colors (e.g., red, green, and blue) can be used to form the sub-pixels of a display system, such as a near-eye display system.

SUMMARY

This disclosure relates generally to display systems. More specifically, this disclosure relates to circuits for driving LED-based display panels. Various inventive embodiments are described herein, including devices, systems, modules, circuits, dies, wafers, packages, methods, processes, materials, and the like.

According to certain embodiments, a display device may include a micro-LED wafer (e.g., a compound semiconductor wafer such as a III-V semiconductor wafer), a silicon wafer including digital drive circuits fabricated thereon, and an indium-gallium-zinc-oxide (IGZO) layer between the micro-LED wafer and the silicon wafer. The IGZO layer includes analog drive circuits fabricated thereon, where the analog drive circuits and the digital drive circuits may have different operating supply voltages. The separation of the digital drive circuits and the analog drive circuits may allow for the optimization of the digital drive circuits and the analog drive circuits using different processing technologies. The analog drive circuits fabricated in the IGZO layer, such as thin-film transistors (TFTs), may have low leakage currents, high voltage sustainability (e.g., for driving micro-LEDs), and small dimensions. The low-leakage of the analog drive circuits may allow for a lower refresh rate of the analog calibration signals or more accurate storage of analog display data, which may increase the color depth of each pixel, reduce power consumption, and improve the uniformity of the display device.

According to certain embodiments, a display device may include a silicon wafer including digital circuits, a micro-light emitting diode (micro-LED) wafer including an array of micro-LEDs, and an indium-gallium-zinc-oxide (IGZO) layer between the silicon wafer and the micro-LED wafer and including analog circuits. The digital circuits may be characterized by a first operating supply voltage and may be configured to generate digital control signals based on digital display data of an image frame. The analog circuits may be characterized by a second operating supply voltage higher than the first operating supply voltage. The analog circuits may include analog storage devices configured to storing analog signals, and transistors controlled by the digital control signals and the analog signals to generate drive currents for driving the array of micro-LEDs. The digital circuits on the silicon wafer or the analog circuits in the IGZO layer may include level-shifting circuits at interfaces between the digital circuits and the analog circuits.

In some embodiments of the display device, the digital circuits may include, for each micro-LED in the array of micro-LEDs, memory cells configured to store digital display data for the micro-LED, a pulse-width modulation (PWM) latch configured to generate PWM signals for modulating a respective drive current of the drive currents, and a comparator configured to compare the digital display data for the micro-LED with a counter value and generate a digital control signal of the digital control signals at an output port of the comparator. In some embodiments, the level-shifting circuits may include an inverter between the output port of the comparator and a gate of a transistor of the transistors in the analog circuits.

In some embodiments of the display device, the analog signals may include analog calibration signals for achieving an uniform intensity among the array of micro-LEDs. The digital circuits may include a memory device configured to store analog calibration data for generating the analog calibration signals. In some embodiments, the analog storage devices may be configured to preserve the analog signals for more than one image frame period after the analog signals are loaded into the analog storage devices. In some embodiments, the analog signals may include analog voltage levels corresponding to one-bit or multi-bit display data of the image frame.

In some embodiments of the display device, the analog circuits may include, for each micro-LED of the array of micro-LEDs, a capacitor configured to store an analog signal of the analog signals, a set of transistors configured to generate, based on the analog signal, a drive current for driving the micro-LED, and a switch connecting the micro-LED to the set of transistors, where the switch may be configured to selectively supply the drive current to the micro-LED based on a digital control signal of the digital control signals generated by the digital circuits. In some embodiments, the switches for micro-LEDs in a row of the array of micro-LEDs may be controlled by a common pre-charge transistor that is configured to turn on the micro- LEDs in the row of the array of micro-LEDs at a beginning of an image frame. In some embodiments, the switch for each micro-LED of micro-LEDs in a row of the array of micro-LEDs may be controlled by a respective pre-charge transistor, and the pre-charge transistors for the micro-LEDs in the row of the array of micro-LEDs may be configured to receive a common control signal such that the switches for the micro-LEDs in the row of the array of micro-LEDs are switched at a same time at a beginning of an image frame to turn on the micro-LEDs in the row of the array of micro-LEDs.

In some embodiments, the analog circuits may include, for each micro-LED of the array of micro-LEDs, a circuit configured to disconnect the respective pre-charge transistor from a power supply. In some embodiments, the capacitor and the set of transistors may form a 2T1C drive circuit. In some embodiments, the capacitor and the set of transistors may form a 4T1C drive circuit, and the 4T1C drive circuit may be configured such that the drive current is independent of a threshold voltage of a transistor of the set of transistors that generates the drive current. In some embodiments, the switch may include a switch transistor, the analog circuits may further include a pull-down transistor, a gate of the pull-down transistor may be electrically connected to the digital circuits to receive the digital control signal, and a drain or source of the pull-down transistor may be electrically connected to a gate of the switch transistor.

In some embodiments, the digital circuits may include test circuits for calibrating the array of micro-LEDs. In some embodiments, the transistors in the analog circuits may include thin-film transistors. In some embodiments, a pitch of the array of micro-LEDs may be equal to or less than 3 µm. In some embodiments, the digital circuits may include at least 8 memory cells for storing digital display data for each micro-LED in the array of micro-LEDs. In some embodiments, the IGZO layer may be bonded to the silicon wafer via a plurality of metal bumps or metal bonding pads. In some embodiments, the IGZO layer may be deposited on the micro-LED wafer or bonded to the micro-LED wafer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIG. 8A illustrates an example of a method of die-to-wafer bonding for arrays of LEDs according to certain embodiments.

FIG. 8B illustrates an example of a method of wafer-to-wafer bonding for arrays of LEDs according to certain embodiments.

FIG. 15A illustrates an example of a pixel in an example of a display device according to certain embodiments.

FIG. 15B illustrates a block diagram of an example of a pixel in a display device according to certain embodiments.

Figure 1:
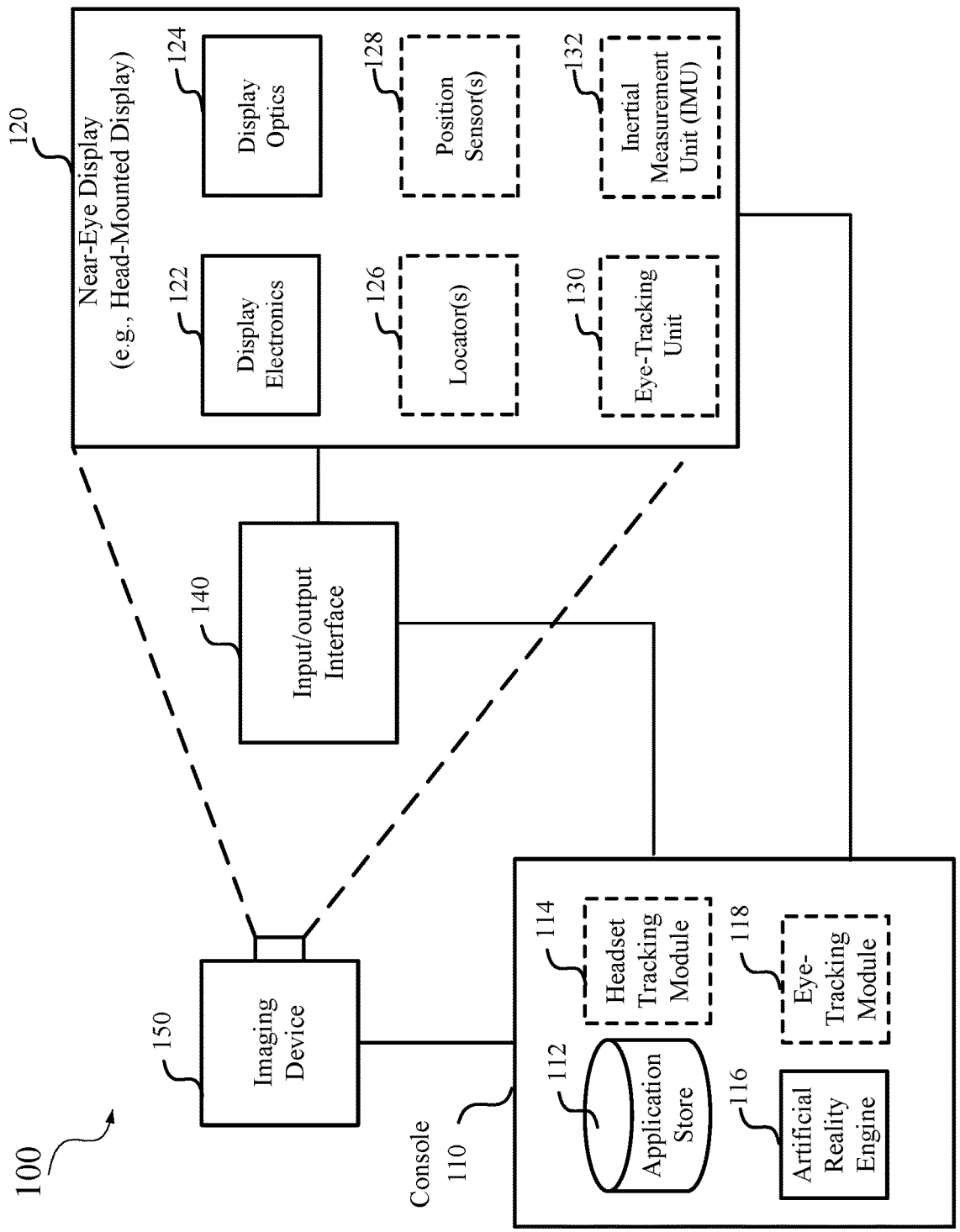
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to display systems. More specifically, and without limitation, techniques disclosed herein relate to circuits and schemes for driving light-emitting diodes (LEDs) in an LED-based display system. Digital drive circuits and analog drive circuits of the drive circuits may be on different wafers, where the analog drive circuits may be fabricated using a low-leakage and high voltage-sustainability process, such as an indium-gallium-zine-oxide (IGZO) process. Techniques disclosed herein can be used to improve performance (e.g., color depth and uniformity), reduce power consumption, and improve manufacturability and testability of LED display in near-eye display systems, such as virtual reality (VR), augmented reality (AR), or mixed reality (MR) display systems. Various inventive embodiments are described herein, including devices, systems, modules, circuits, dies, wafers, packages, methods, processes, materials, and the like.

In some LED-based displays, one or more two-dimensional (2-D) arrays of micro-LEDs may be used to display color images. Each 2-D array of micro-LEDs may include thousands or millions of micro-LEDs that can emit light of a same color (e.g., red, green, or blue) at desired intensities to generate an image, where each micro-LED may form a part of a color pixel and may (in combination with the corresponding drive circuits) be referred to herein as a pixel or a unit pixel. Each 2-D array of micro-LEDs may be controlled by drive circuits such that the micro-LEDs may emit light at the desired intensities. The 2-D array of micro-LEDs may be fabricated on, for example, a III-V semiconductor substrate, while the drive circuits may generally be fabricated on a silicon substrate. To facilitate bonding and electrical connection between the 2-D array of micro-LEDs and the drive circuits and to avoid long interconnects, the drive circuits may have a pixel pitch matching the pixel pitch of the 2-D array of micro-LEDs, which may be, for example, less than about 20 µm, less than about 10 µm, less than about 5 µm, less than about 3 µm, or less than about 2 µm.

The drive circuits may read display data for image frames from local memory at each pixel, and generate pulse-width modulation (PWM) signals based on the display data to modulate drive currents and thus the brightness of micro-LEDs. The drive circuits may include, for example, bitcells (such as local static random-access memory (SRAM) cells) for storing the display data (e.g., intensity data), digital circuits for generating the PWM signals and other digital control signals, and analog circuits interfacing with the high-voltage micro-LEDs and controlling the drive currents of the micro-LEDs using the PWM signals. The bit depth or color depth (e.g., the number of bits) of the display data for each pixel may affect the number of intensity levels of the light emitted by the pixel. It is generally desirable that the bit depth is greater than, for example, 6, in order to display images with sufficient number of brightness levels. The capacity and the density of bitcells in the local memory (e.g., SRAM) may be constrained by, for example, the design of the pixel circuits, the size of the pixel, and the process technology. The drive circuits may be controlled by periphery circuits that write the image display data to the bitcells, sequence the logic, and generate counter values to generate a respective pulse-width modulated analog current for each micro-LED.

To achieve a good display quality, the drive circuits and the periphery circuits for operating a micro-LED array may need to meet certain specifications. For example, in order to display images with sufficient number of brightness levels, it is desirable that the capacity and the density of bitcells in the local memory (e.g., SRAM) for storing display data be high. When all drive circuits are fabrication on a silicon backplane, the capacity of the bitcells in the local memory may be constrained by the design of the pixel circuits, the process technology (e.g., certain physical design rules, such as minimum feature size), and the limited silicon area for the bitcells in each pixel.

In addition, the drive circuits may need to deliver low-variation analog drive currents to the micro-LEDs to avoid brightness variations. However, due to the variability of the micro-LED drive transistors (e.g., caused by the random dopant fluctuation and the small size of each micro-LED drive transistor), the drive current and therefore the brightness may vary significantly among the micro-LEDs. The brightness variations may be visible to user's eyes and may affect the user experience. To compensate the variability of the micro-LED drive transistors, analog calibration signals for the pixels may be determined during a calibration process, and may be loaded into individual drive circuits before turning on the micro-LEDs such that the drive circuits may use the analog calibration signals to provide appropriate drive currents to the micro-LEDs. In CMOS circuits, the leakage current may be high, in particular, when the feature sizes of the components are small. Due to the leakage of the drive circuits, the analog calibration signals may need to be loaded into the drive circuits periodically in order to maintain the correct signal levels of the analog calibration signals in the drive circuits.

Furthermore, the drive circuits for micro-LEDs may include various types of circuits, such as column and row drivers, comparators, PWM latches, counters, memory cells, current drivers, passive components (e.g., resistors and capacitors), and the like. These circuits may include high-speed digital circuits, analog circuits, and memory cells, which may have different performance requirements (e.g., speed, power consumption, leakage current, and signal accuracy), different operation conditions (e.g., different supply voltages), and different fabrication challenges (e.g., density, feature size, and variation tolerance). For example, the digital circuits may include high density SRAM cells, comparators, and PWM latch circuits that may operate at high speed and low supply voltage (e.g., less than about 1.2 V or 1 V), while the analog circuits may include larger transistors that operate at medium or high supply voltage levels (e.g., greater than about 2 V or higher) and can provide accurate and large drive current. It can be difficult to optimize both the low-voltage digital circuits and the medium-voltage (or high-voltage) analog circuits on a same wafer using a same process flow. For example, process technologies used to fabricate high density, high speed, low voltage, and low power consumption digital circuits may not be suitable for making analog circuits that have low leakage currents, large voltage swing, and low performance variation.

When all digital and analog drive circuits are fabrication on a same silicon backplane, transition regions and/or spacing may be needed between the different types of circuits (e.g., SRAM cells, digital circuits, analog circuits, high voltage circuits, etc.) in each pixel and between pixels. Thus, a large portion of the pixel area may be used as the transition regions or the spacing between the different types of circuits. Therefore, the number of local memory cells that can fit in each pixel may be limited. Optimizing the layout design may help to reduce the transition regions, but may not minimize the transition regions as desired in order to make more space for additional circuits (e.g., more bitcells) because transition regions are still needed between different types of circuits.

According to certain embodiments, a display device may include a micro-LED wafer (e.g., a compound semiconductor wafer such as a III-V semiconductor wafer), a silicon wafer including digital circuits fabricated thereon, and an indium-gallium-zinc-oxide (IGZO) layer including analog drive circuits fabricated therein. The IGZO layer may be between the micro-LED wafer and the silicon wafer, and may be fabricated in a separate process on the micro-LED wafer, the silicon wafer, or another wafer (e.g., a glass substrate, a polyimide substrate, or a semiconductor substrate). The separation of the digital drive circuits and the analog drive circuits may allow for the optimization of the digital drive circuits and the analog drive circuits using different processing technologies. For example, the digital drive circuits on the silicon wafer can be designed and fabricated using the state-of-art digital design and processing technology, while the analog drive circuits, such as thin-film transistors (TFTs), may be fabricated in the IGZO layer to achieve low leakage currents, high voltage sustainability (e.g., for driving micro-LEDs), small dimensions, and low variations. In some embodiments, the analog drive circuits may be fabricated in another material layer (different from IGZO) that may be suitable for making analog drive circuits with low leakage currents, high voltage sustainability, and low variations, such as low-temperature polycrystalline silicon (LTPS) and amorphous silicon (a-Si).

The low-leakage of the analog drive circuits in the IGZO layer (or another material layer) may allow for more accurate storage of analog display data of different voltage levels for analog driving, which may increase the bit depth or color depth of each pixel. Additionally or alternatively, the analog driving scheme may be used for pixel calibration, where the calibrated analog signal for each pixel may be loaded into an analog storage device (e.g., a capacitor) and may remain constant in the analog storage device for a long time period (e.g., up to about a few hundred seconds) due to the low leakage of the analog drive circuits in the IGZO layer. Therefore, the calibrated analog signal for each pixel can be refreshed at a frequency much lower than the frame rate, and thus the power consumption of the analog drive circuits can be significantly reduced.

Because the analog drive circuits are not fabricated on the silicon wafer, the silicon wafer may have room for more memory cells for each pixel. The silicon wafer may also have room for other circuits, such as real-time calibration circuits or design-for-test circuits. In some embodiments, because the digital drive circuits and the analog drive circuits are on different wafers, the IGZO layer may have room for additional analog circuits. For example, circuits for in-pixel compensation of the variations in the analog drive circuits may be implemented in the IGZO layer to compensate threshold voltage ($V_{th}$) and/or mobility ($\mu$) variations, such that the drive current may be independent of the threshold voltage of the analog current drive transistor. Due to the in-pixel compensation, the calibration of the pixels may be much easier or simpler.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
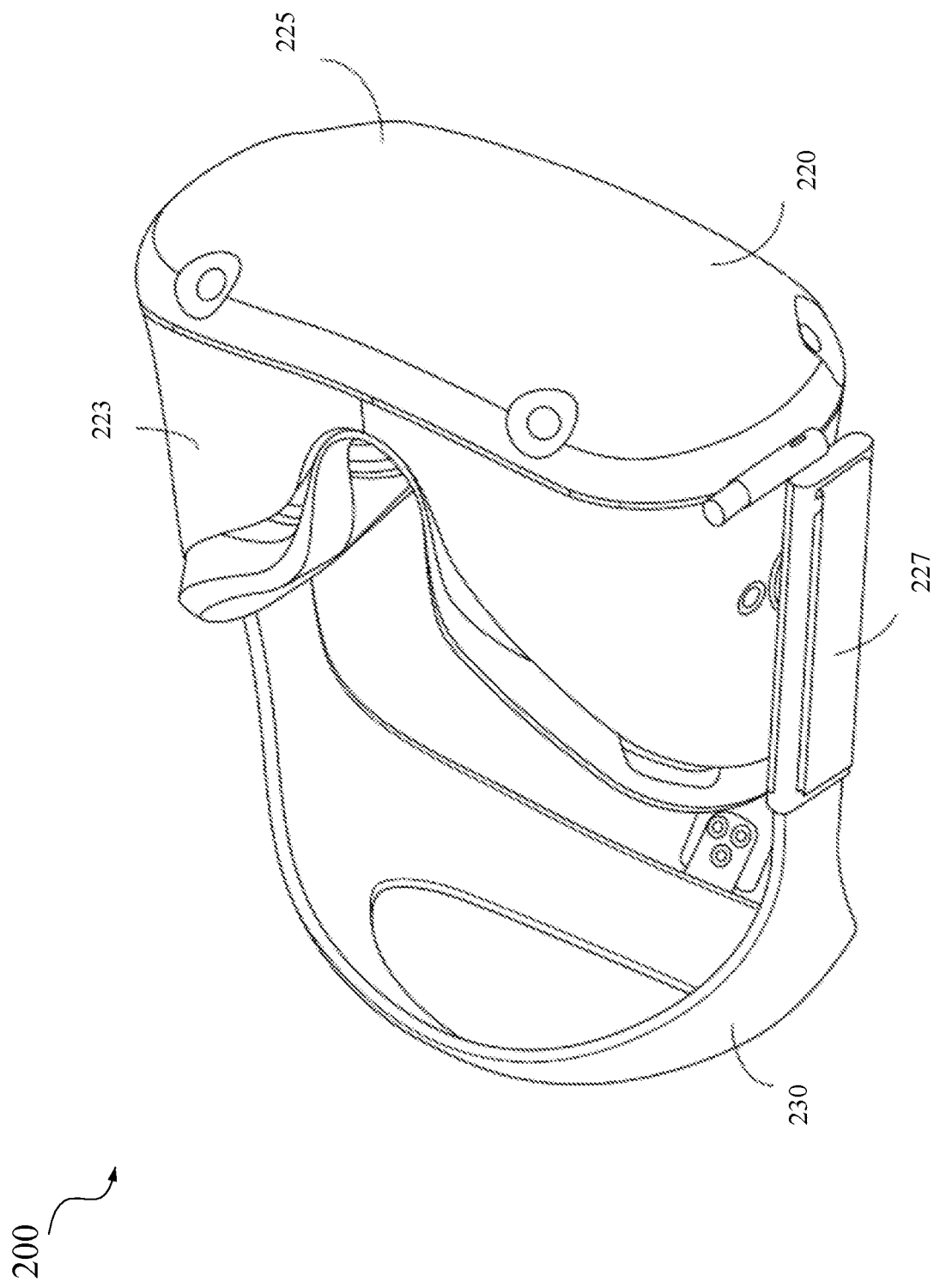
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
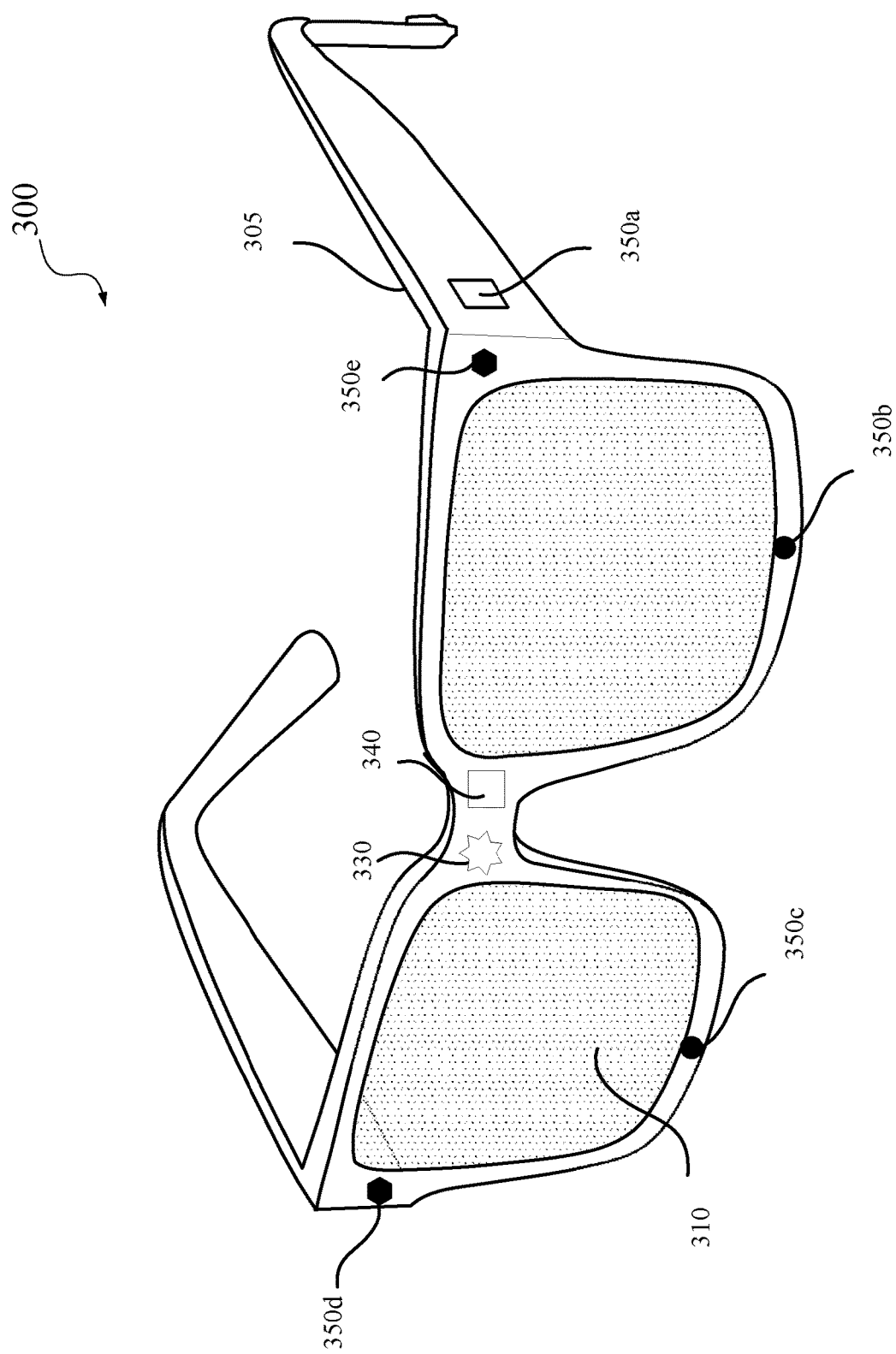
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
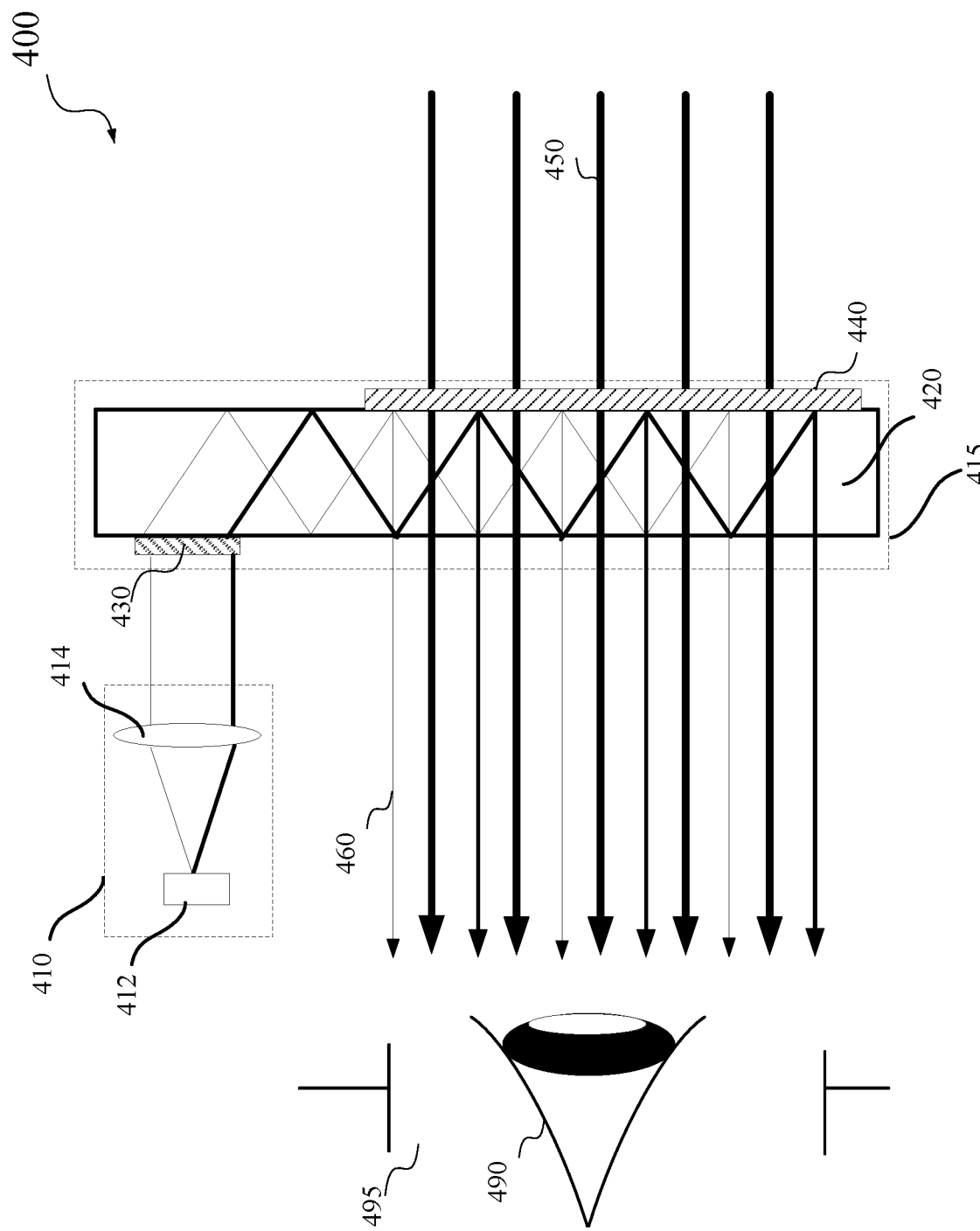
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
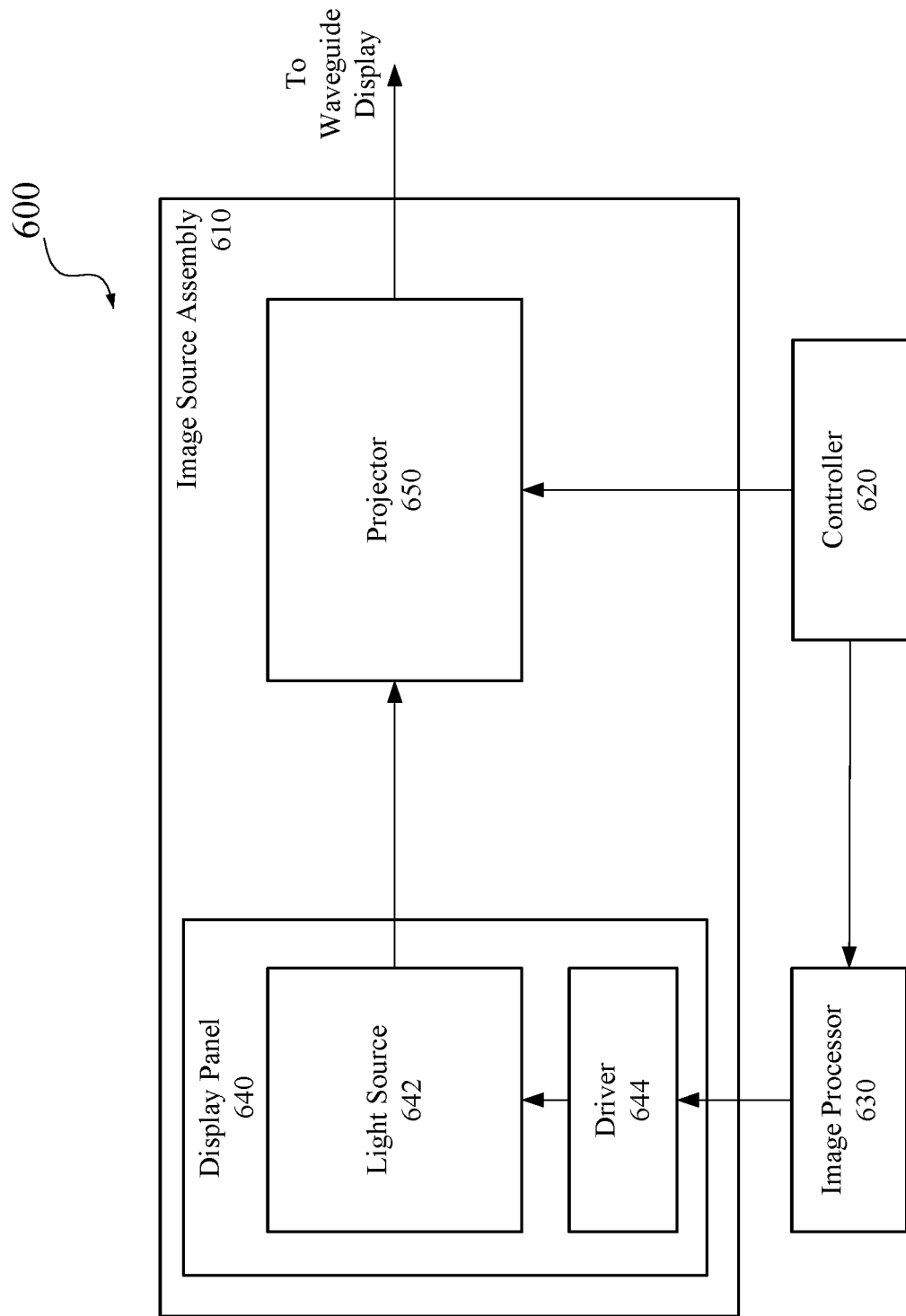
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
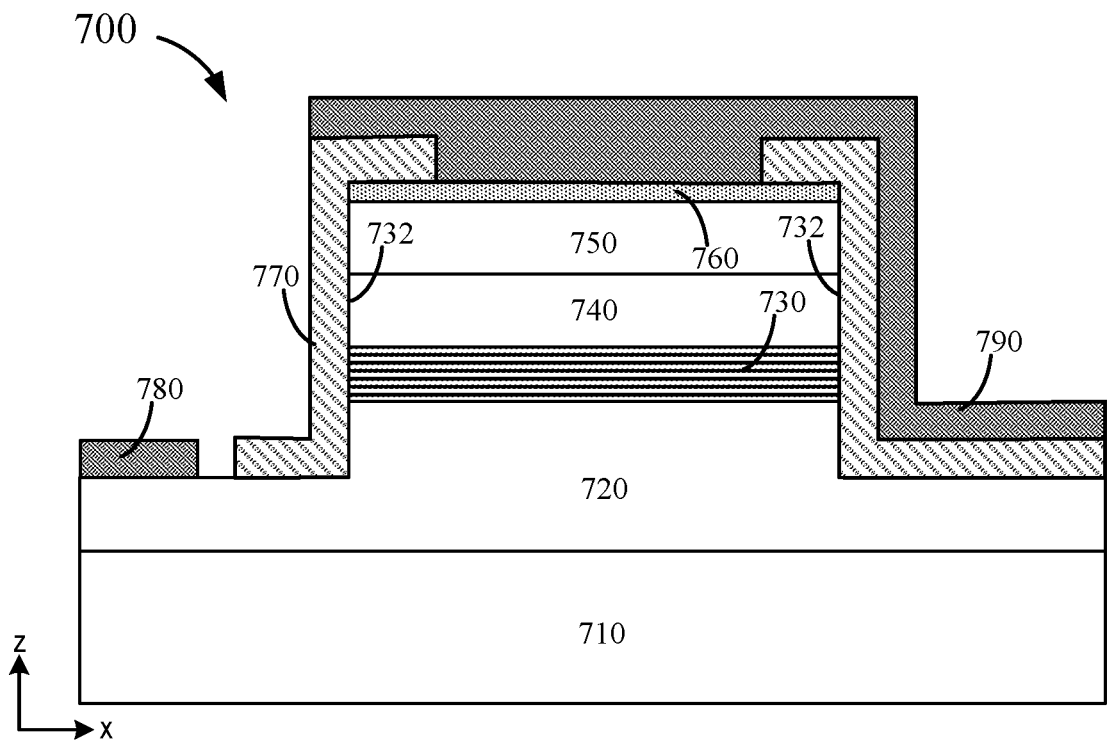
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
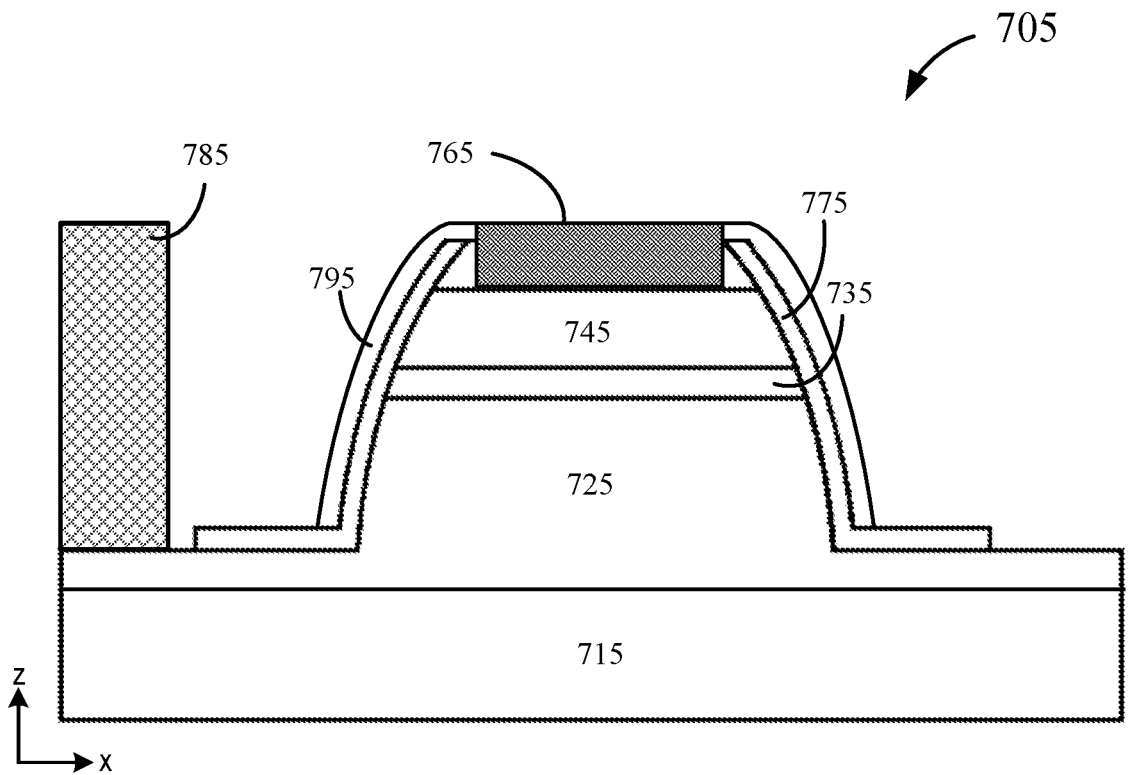
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. Base layer 809 may include, for example, a silicon wafer. Driver circuits 811 may be used to control the operations of LEDs 807. For example, the driver circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding driver circuits 811 on wafer 803. In one example, LED array 801 may be brought toward wafer 803 until LEDs 807 come into contact with respective metal pads or bumps corresponding to driver circuits 811. Some or all of LEDs 807 may be aligned with driver circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlInGaP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes driver circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

Figure 9A:
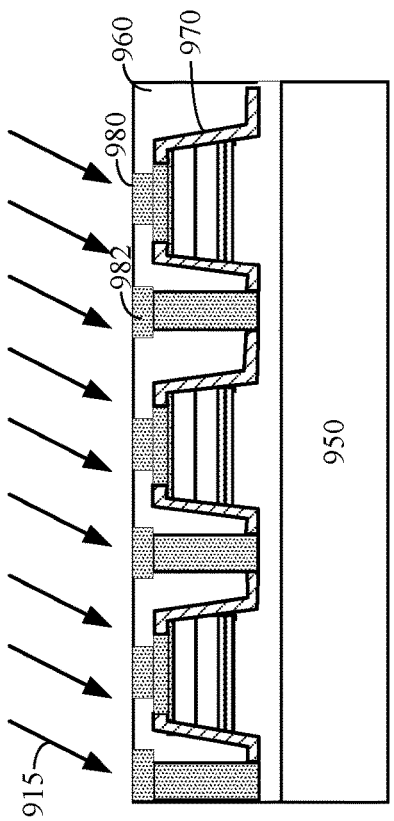
FIGS. 9A-9D illustrate an example of a method of hybrid bonding for arrays of LEDs according to certain embodiments.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include driver circuits for the arrays of LEDs. A bonding layer may include dielectric regions 940 and contact pads 930 connected to circuits 920 through electrical interconnects 922. Contact pads 930 may include, for example, Cu, Ag, Au, Al, W, Mo, Ni, Ti, Pt, Pd, or the like. Dielectric materials in dielectric regions 940 may include SiCN, SiO$_2$, SiN, Al$_2$O$_3$, HfO$_2$, ZrO$_2$, Ta$_2$O$_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

Figure 9B:
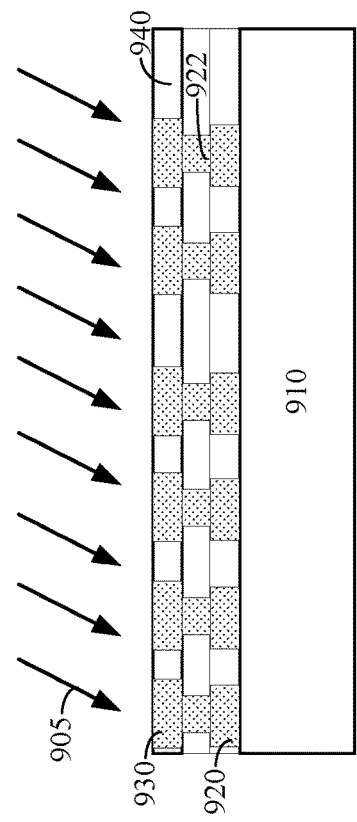

FIG. 9B illustrates a wafer 950 including an array of micro-LEDs 970 fabricated thereon as described above with respect to, for example, FIGS. 7A-8B. Wafer 950 may be a carrier wafer and may include, for example, GaAs, InP, GaN, AlN, sapphire, SiC, Si, or the like. Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, SiO$_2$, SiN, Al$_2$O$_3$, HfO$_2$, ZrO$_2$, Ta$_2$O$_5$, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

Figure 9C:
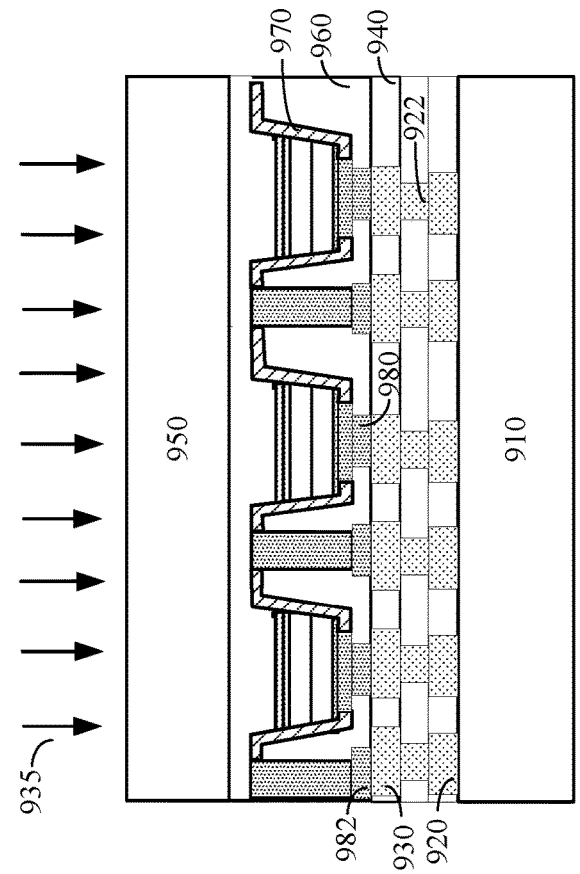

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

Figure 9D:
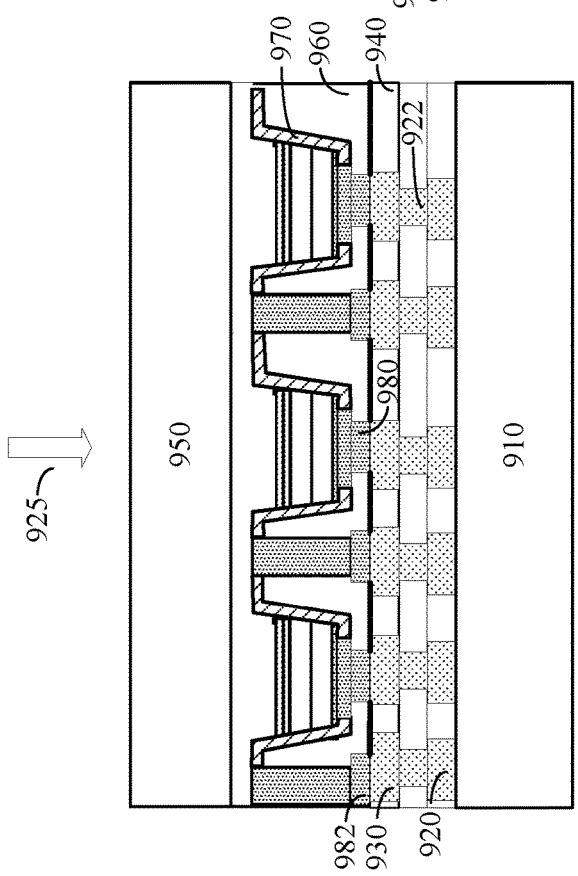

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 200-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
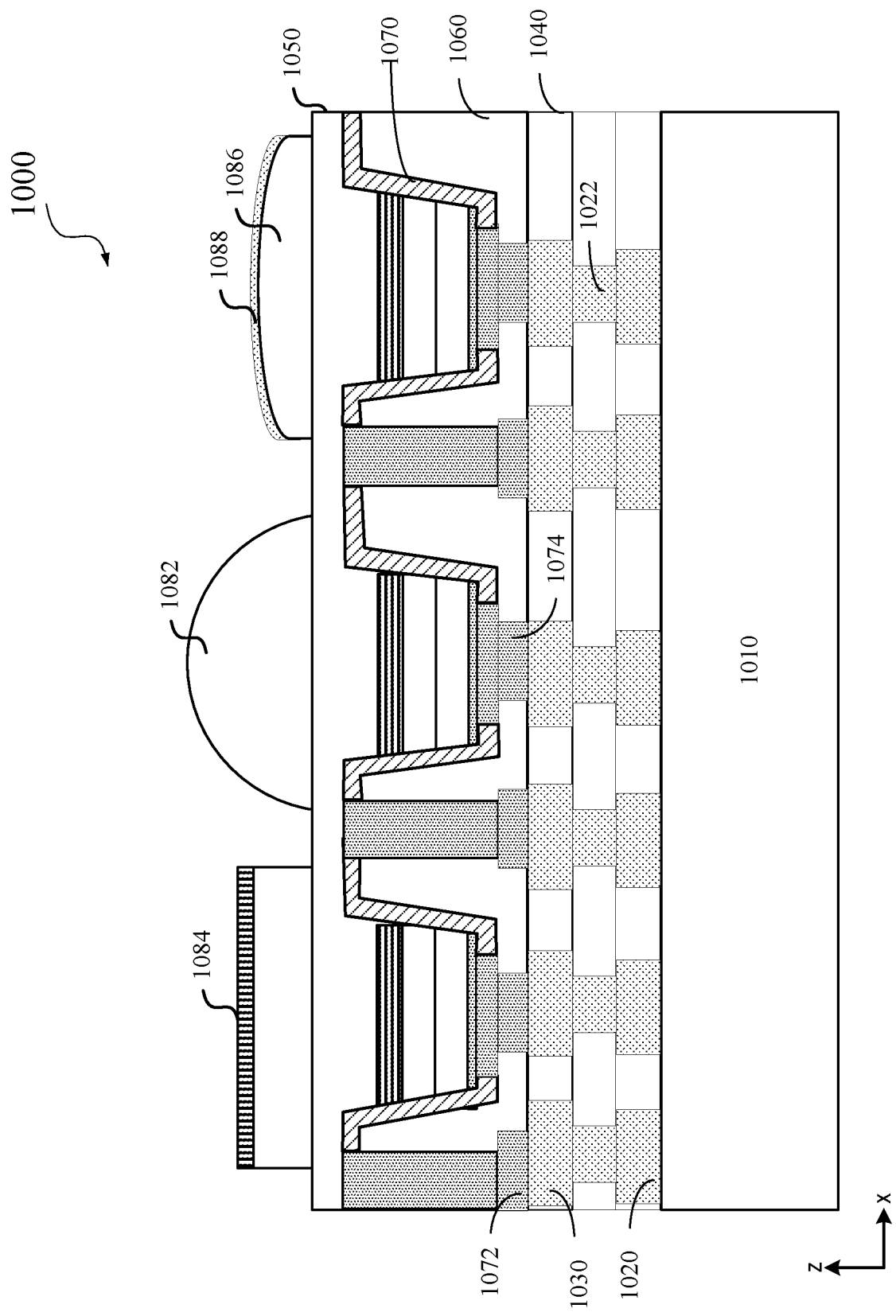
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIG. 9A-9D. LED array 1000 may include a substrate 1010, which may be, for example, a silicon wafer. Integrated circuits 1020, such as LED driver circuits, may be fabricated on substrate 1010. Integrated circuits 1020 may be connected to p-contacts 1074 and n-contacts 1072 of micro-LEDs 1070 through interconnects 1022 and contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

Figure 11:
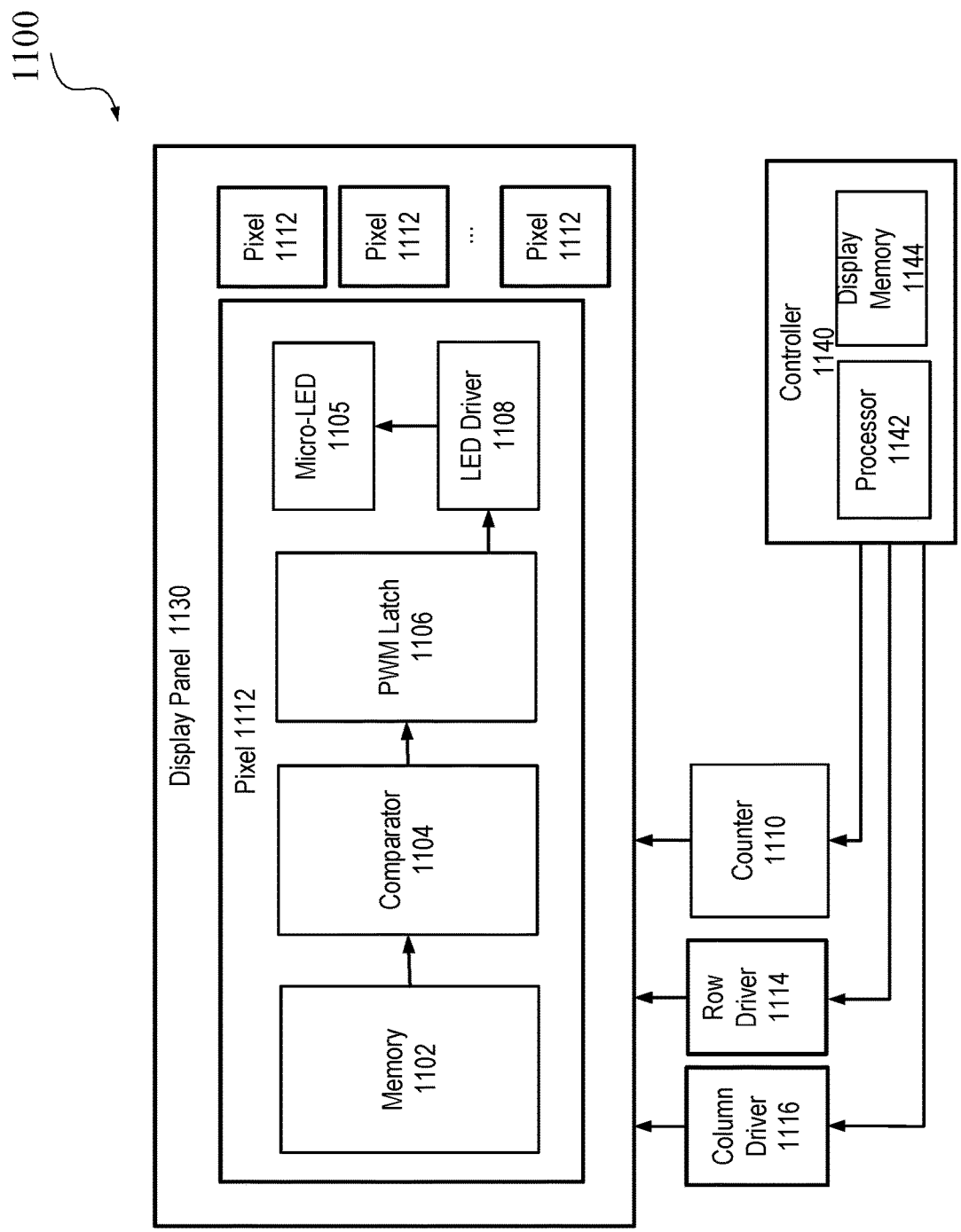
FIG. 11 is a simplified block diagram of an example of a display device according to certain embodiments.

FIG. 11 is a simplified block diagram of an example of a display device 1100 according to certain embodiments. Display device 1100 may include a display panel 1130 that includes an array (e.g., a 2-D array) of pixels 1112. Display panel 1130 may be an example of display panel 640. FIG. 11 illustrates the block diagram of one pixel 1112, which may be similar to other pixels 1112 in the array of pixels. Various functional components of each pixel 1112 may generate digital PWM signals to control a micro-LED. In the illustrated example, each pixel 1112 may include a micro-LED 1105, which may emit light at an intensity level that is controlled by the PWM signals. The circuits that control micro-LED 1105 in pixel 1112 may include a memory device 1102, a comparator 1104, a PWM latch circuit 1106, and an LED driver circuit 1108. Memory device 1102 may be a part of pixel 1112 or may be outside of pixel 1112. Memory device 1102 may include, for example, SRAM cells, and may store the intensity data for pixel 1112. Memory device 1102 may be connected to comparator 1104, which may be connected to PWM latch circuit 1106. PWM latch circuit 1106 may be connected to LED driver circuit 1108 to control LED driver circuit 1108 to provide a pulse width modulation to a drive current that may be an approximately constant current. LED driver circuit 1108 may drive micro-LED 1105 with the drive current for different periods of time based on the PWM signals to emit different amounts of light during a PWM frame (also referred to as a PWM cycle). In general, the longer micro-LED 1105 is driven at the current level within a PWM cycle, the brighter micro-LED 1105 may be perceived by an observer.

Display device 1100 may also include a row driver 1114, a column driver 1116, and a counter 1110. In some embodiments, row driver 1114, column driver 1116, and counter 1110 may be parts of the periphery circuits of display panel 1130. Row driver 1114 and column driver 1116 may be connected to pixels 1112. For example, row driver 1114 may be connected to memory device 1102, comparator 1104, and PWM latch circuit 1106. Column driver 1116 may be connected to memory device 1102. Display device 1100 may further include a controller 1140, which may include a processor 1142 and a display memory device 1144. Controller 1140 may be connected to row driver 1114 and column driver 1116 to control the operations of row driver 1114 and column driver 1116. For example, processor 1142 of controller 1140 may provide control signals to row driver 1114 and column driver 1116 to operate pixels 1112. Counter 1110 may be coupled to display memory device 1144, which may store, for example, calibration data and/or a gamma correction look-up table (LUT).

Memory device 1102 may include digital data storage cells, such as cells of SRAM or some other types of memory. For example, memory device 1102 may include multiple memory cells for storing the display data (e.g., intensity data) for pixel 1112. Each cell in memory device 1102 may be connected to row driver 1114 via a word line (WL) and may be connected to column driver 1116 via a bit line (BL) and an inverse bit line (BL). Memory device 1102 may receive WL signals from row driver 1114 for memory word selection, and may receive, from column driver 1116, control words in the form of data bits for writing to the selected memory cells. The bit values of data bits define the intensity level of the pixel for a PWM frame. The number of data bits (or bitcells) in a control word may vary. In one example, each control word in memory device 1102 may include 3 bitcells storing a 3-bit value representing one of eight levels of brightness (e.g., 000, 001, 010, 011, 100, 101, 110, and 111). In another example, each control word in the memory device 1102 may include 8 bitcells storing an 8-bit value representing one of 256 levels of brightness.

Counter 1110 may be used to generate counter values (e.g., a clock cycle count) based on a clock signal. The counter value of counter 1110 may be compared with the value of a control word from memory device 1102 by comparator 1104 to generate a comparison result. For example, the comparison result may be generated based on an exclusive OR (XOR) of each data bit in the control word and the corresponding bit of the counter value. Comparator 1104 may include a dynamic comparison node that switches between a high and low level according to the comparison result, and may output the comparison result to PWM latch circuit 1106 to generate PWM signals.

LED driver circuit 1108 may include one or more LED drive transistors. One of the LED drive transistors may have a source or drain terminal connected to micro-LED 1105. One of the LED drive transistors may include a gate terminal connected to PWM latch circuit 1106 to receive the PWM signal for modulating the current flowing through the source and drain terminals of the driving transistor into micro-LED 1105.

Figure 12A:
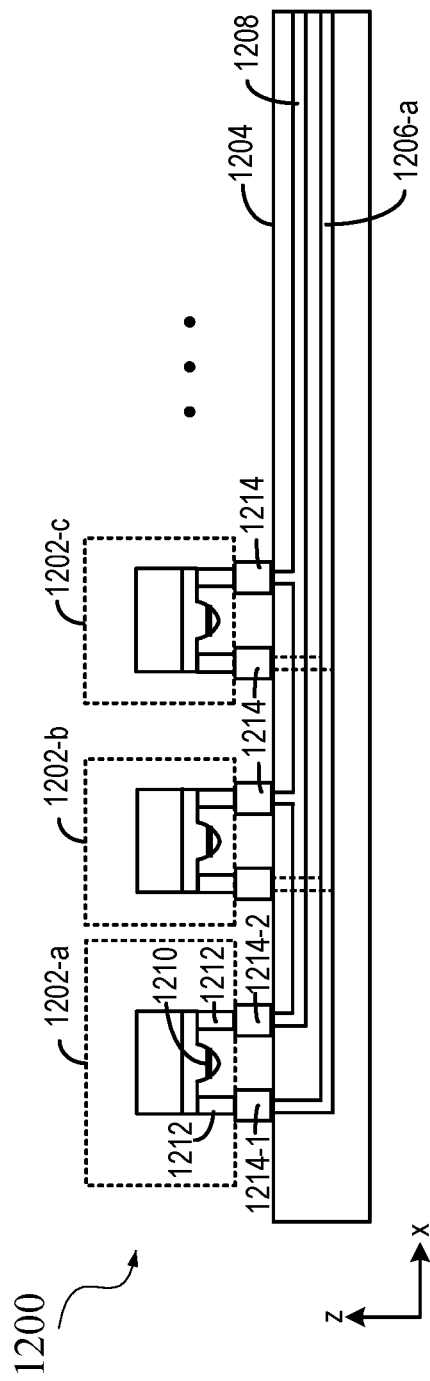
FIG. 12A is a side view of an example of a display device.
Figure 12B:
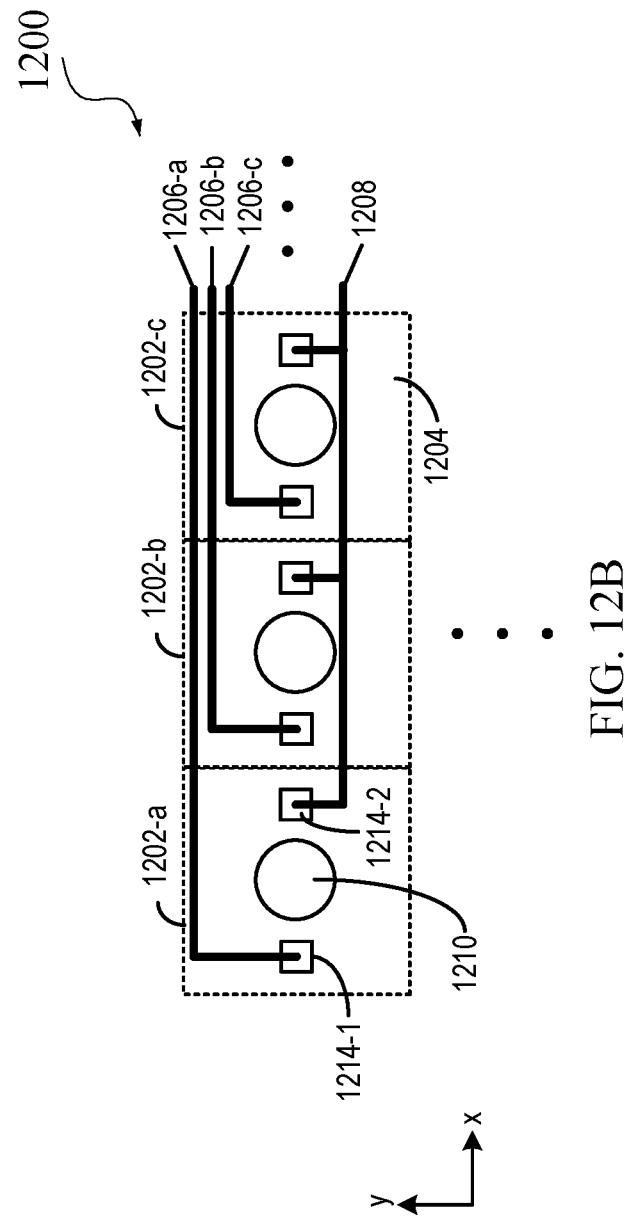
FIG. 12B is a top view of the example of display device of FIG. 12A.

FIG. 12A is a side view of an example of a display device 1200. FIG. 12B is a top view of the example of display device 1200 of FIG. 12A. Display device 1200 may be part of a light source (e.g., light source 540 or 642) of a near-eye display, and may include a plurality of LEDs, such as micro-LEDs. Although the example shown in FIGS. 12A and 12B is based on micro-LED devices, it is understood that the example in FIGS. 12A and 12B is applicable to other types of light emitters, such as semiconductor lasers and various types of LEDs.

In the example shown in FIGS. 12A and 12B, display device 1200 may include an array of micro-LEDs 1202 (micro-LED 1202-*a*, micro-LED 1202-*b*, micro-LED 1202-*c*, and the like) bonded to a backplane 1204. Backplane 1204 may include a structure for attaching a plurality (e.g., a 2-D array) of micro-LEDs 1202, and may provide electrical connections and/or structural support for the plurality of micro-LEDs 1202. Backplane 1204 may include traces connected to other components to provide electrical signals to the LED devices for controlling information displayed by the display elements. Backplane 1204 may also include electrical contact points, such as metal pads, which may provide access to the traces. For example, as shown in FIGS. 12A and 12B, backplane 1204 may include electrical traces 1206-*a*, 1206-*b*, 1206-*c*, and the like, to electrically connect with, micro-LED 1202-*a*, micro-LED 1202-*b*, micro-LED 1202-*c*, and the like, respectively. Electrical traces 1206-*a*, 1206-*b*, 1206-*c*, and the like allow each micro-LED to be individually controlled by applying different signals to different micro-LEDs. Backplane 1204 may also include an electrical trace 1208 that may act as a return current path for each micro-LED.

Each of micro-LED 1202-*a*, micro-LED 1202-*b*, and micro-LED 1202-*c* may have a structure similar to LED 700 of FIG. 7A, LED 705 of FIG. 7B, or other LED structures. Each micro-LED 1202 in FIGS. 12A and 12B may include an active region 1210 and contacts 1212. While FIGS. 12A and 12B illustrate that contacts 1212 are of rectangular shapes, it is understood that contacts 1212 can take on other shapes including, for example, rounded shapes, dome shapes, and the like. One contact 1212 of micro-LED 1202 may be connected to a p-type contact pad, and another contact 1212 of micro-LED 1202 may be connected to an n-type contact pad. Bumps 1214 may provide electrical connections between micro-LED 1202 (more specifically, contacts 1212) and backplane 1204. In some embodiments, bumps 1214 are solder bumps attached or deposited on underbump metallization structures.

Figure 13:
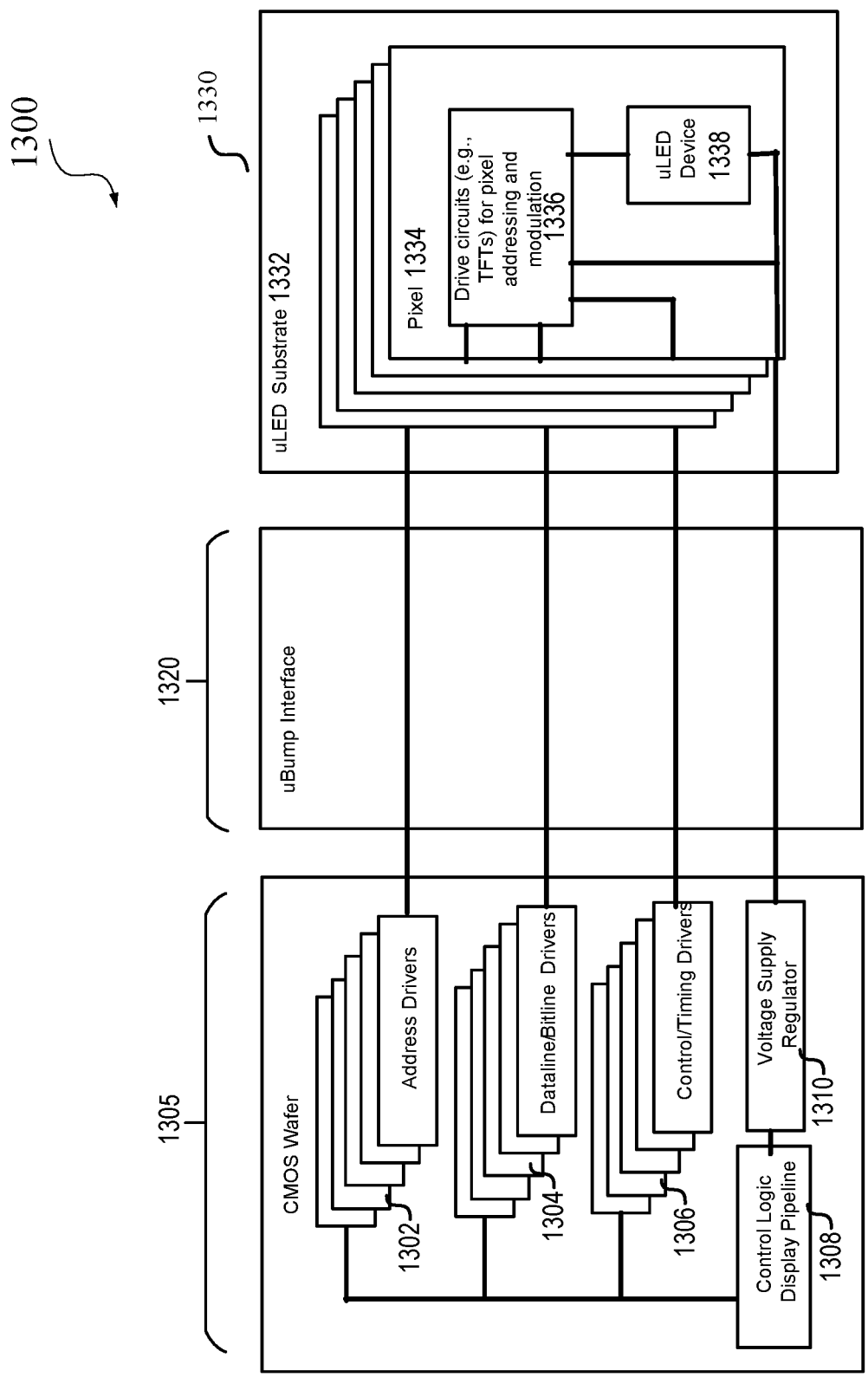
FIG. 13 illustrates an example of an architecture of a display device.

FIG. 13 illustrates an example of an architecture of a display device 1300 according to certain embodiments. Display device 1300 may include a backplane 1305 bonded to a micro-LED wafer 1330 through a micro-bump interface 1320. As shown in FIG. 13, backplane 1305 may be a CMOS wafer including a plurality of address drivers 1302, dataline/bitline drivers 1304, and control/timing drivers 1306. Address drivers 1302 may generate selection signals to select one or more pixel TFTs (and the corresponding LEDs). The selection signals may specify, for example, an address (e.g., a row address and/or a column address) of a target LED. Dataline/bitline drivers 1304 may generate the operation signals to set magnitudes of currents flowing through the LEDs. Control/timing drivers 1306 may generate timing signals to control timing of the operation signals. The drivers described above may be controlled by a control logic display pipeline 1308. Backplane 1305 may also include a voltage supply regulator 1310 to supply a voltage (and ground) to the LEDs.

Micro-LED wafer 1330 may include a plurality of pixels 1334 formed on a micro-LED substrate 1332. Each pixel 1334 may include drive circuits 1336 for pixel addressing and intensity modulation, and one or more micro-LEDs 1338. Drive circuits 1336 may be formed in a thin-film circuit (e.g., TFT) layer deposited on micro-LED substrate 1332. In some embodiments, the thin-film circuit layer may include a selector multiplexor for applying signals to pixel circuits. A target pixel 1334 may be selected/enabled by the selection signals and control the current flowing through the corresponding LED based on the operation signals and the timing signals. Backplane 1305 may be configured to transmit a global signal through metal bonds in micro-bump interface 1320 to the thin-film circuit layer, wherein the global signal may include one or more of row selection data, column selection data, analog bias, voltage supply, pulse clock, or test signal.

Figure 14B:
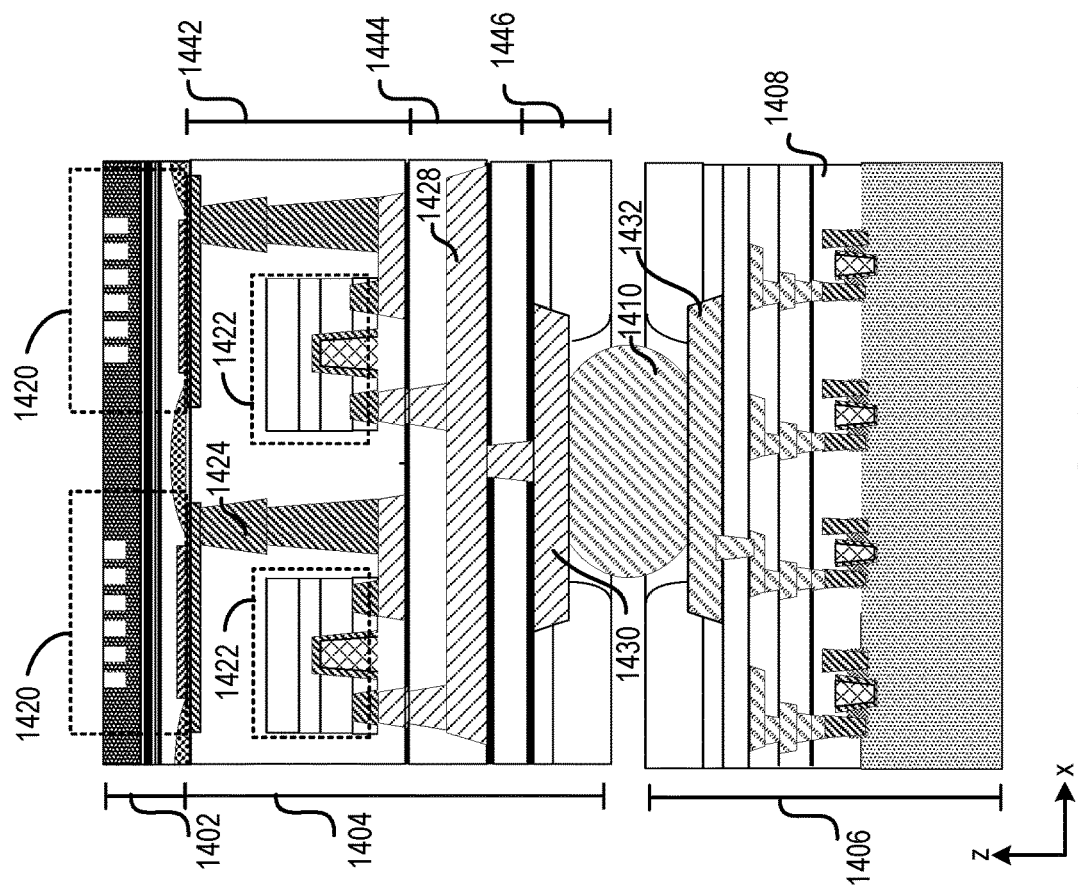
FIG. 14B illustrates a cross-sectional view of an example of the display device of FIG. 14A.
Figure 14A:
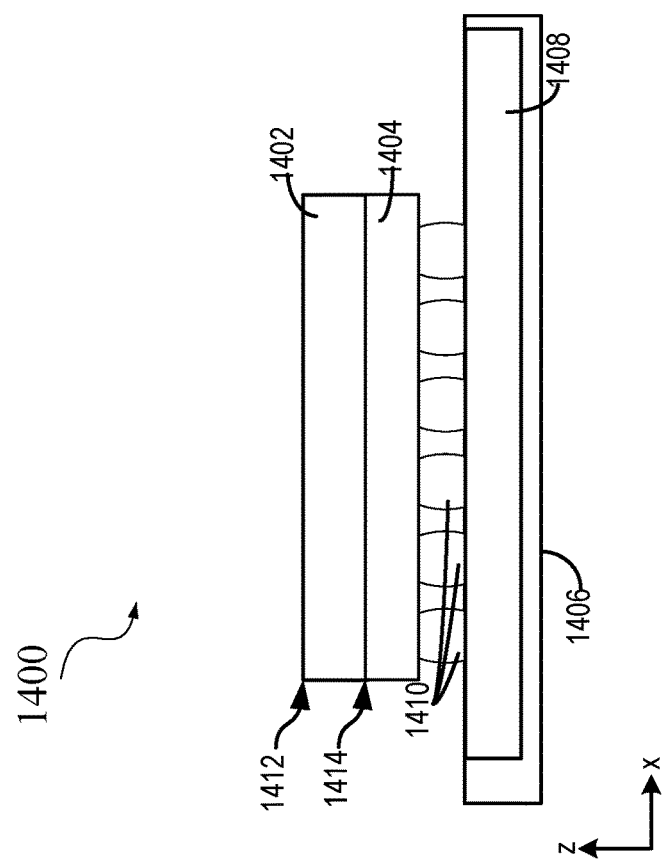
FIG. 14A illustrates an example of a display device including a thin-film circuit layer deposited on an LED array and bonded to a backplane.

FIG. 14A illustrates an example of a display device 1400 including a thin-film circuit layer 1404 deposited on a micro-LED layer 1402, and a backplane 1406 bonded to thin-film circuit layer 1404 through bumps 1410. Backplane 1406 may include CMOS circuits 1408. Bumps 1410 may electrically connect thin-film circuit layer 1404 with CMOS circuits 1408 on backplane 1406. Micro-LED layer 1402 may be a support structure for thin-film circuit layer 1404. Thin-film circuit layer 1404 may include circuitry for controlling operations of micro-LEDs in micro-LED layer 1402. Micro-LED layer 1402 and thin-film circuit layer 1404 may form a vertical stack (e.g., along the z direction).

Micro-LED layer 1402 may include an array of micro-LEDs. The array of micro-LEDs may include a layered epitaxial structure including a first doped semiconductor layer (e.g., a p-doped layer), a second doped semiconductor layer (e.g., an n-doped layer), and a light-emitting region (e.g., including quantum well layers and quantum barrier layers) between the first doped semiconductor layer and the second doped semiconductor layer. Micro-LED layer 1402 may have a light-emission side 1412 (e.g., light is emitted in the z direction) and a side 1414 opposing light-emission side 1412.

Thin-film circuit layer 1404 may be deposited on side 1414 of micro-LED layer 1402. Thin-film circuit layer 1404 may be formed by depositing uniform, amorphous thin films of active semiconductor having high carrier mobility, dielectric layers, and metallic contacts over a supporting substrate (e.g., non-conducting). For example, thin-film circuit layer 1404 may include c-axis aligned crystal indium-gallium-zinc oxide (CAAC-IGZO), amorphous indium gallium zinc oxide (a-IGZO), zinc oxide, and the like. The supporting substrate may include, for example, a silicon substrate or a transparent substrate, such as a glass substrate.

Backplane 1406 may be coupled with thin-film circuit layer 1404 using a plurality of bumps 1410 (or bonding pads). Backplane 1406 may include drive circuits for supplying control signals or drive currents to thin-film circuit layer 1404 through the plurality of bumps 1410. For example, backplane 1406 may include a silicon substrate, and CMOS circuits 1408 may include drive circuits (e.g., transistors) fabricated on the silicon substrate (e.g., in the silicon substrate or in one or more material layers deposited on the silicon substrate). CMOS circuits 1408 may generate the selection signals and control signals to select, for example, rows of LEDs to emit light sequentially to form a scanning display.

The plurality of bumps 1410 may be used as metal bonds to bond backplane 1406 to thin-film circuit layer 1404. The number of bumps 1410 (metal bonds) may be equal to or less than the number of micro-LEDs in the array of micro-LEDs because thin-film circuit layer 1404 may include circuits (e.g., shared data lines, shared control lines, address decoders, multiplexors, and switches) for sending data from backplane 1406 to multiple micro-LEDs through one bump 1410. Each bump 1410 may carry signals targeted at a particular micro-LED or a group of micro-LEDs.

In display device 1400, each micro-LED can form a pixel, or multiple micro-LEDs can form a pixel (e.g., one or more red, green, or blue LEDs can form a pixel). Thin-film circuit layer 1404 may include groups of TFTs, with each group of TFTs may control the operation of a corresponding micro-LED or group of micro-LEDs. For example, a group of TFTs may control the magnitude of the current that flows through the corresponding micro-LED, to control an intensity of the light emitted by the micro-LED. The TFTs can control the pixels based on control signals received from CMOS circuits 1408 on backplane 1406, which may include arrays of high speed digital drive circuits. The control signals can be received by the TFTs at thin-film circuit layer 1404 via bumps 1410.

FIG. 14B illustrates a cross-sectional view of an example of display device 1400. As illustrated, micro-LED layer 1402 may include a plurality of micro-LEDs 1420. Micro-LEDs 1420 may be formed on a substrate compatible with LED materials and operation (e.g., III-V or III-Nitride materials, including Gallium Nitride (GaN), GaN on Si (Silicon), GaN on Sapphire, Indium Gallium Arsenide (InGaAs), Aluminum Indium Gallium Phosphide (AlInGaP), Gallium Arsenide (GaAs), etc.). Each micro-LED 1420 may include, for example, an active region, a reflector, and/or a light extraction structure (e.g., lens or grating).

Thin-film circuit layer 1404 may include, for example, a transistor layer 1442 (e.g., a TFT layer), an interconnect layer 1444, and a bonding layer 1446 (e.g., a layer comprising a plurality of under bump metallization pads to allow interconnect bumps to be attached to. Transistor layer 1442 may include one or more electrical devices, such as TFTs 1422, metal vias 1424, interconnects, capacitors, resistors, and the like (e.g., monolithically formed on micro-LED layer 1402 or another substrate). As described above, TFTs 1422 may include materials such as c-axis aligned crystal indium-gallium-zinc oxide (CAAC-IGZO), amorphous indium gallium zinc oxide (a-IGZO), low-temperature polycrystalline silicon (LTPS), amorphous silicon (a-Si), and the like. Each TFT 1422 may include, for example, a top-gate or bottom gate, and top contacts or bottom contacts. In some embodiments, at least some TFTs 1422 may be trench gate self-aligned (TGSA) thin-film transistors. TFTs 1422 can be formed on side 1414 of micro-LED layer 1402.

Interconnect layer 1444 may include a signal line 1428 (e.g., a control line or a data line). Bonding layer 1446 may include a plurality of bonding pads 1430 for bonding to bumps 1410. Bumps 1410 may include copper, copper alloys, aluminum, tungsten, and the like. One signal line 1428 may connect a plurality of pixel circuits (e.g., for a plurality of micro-LEDs 1420) in transistor layer 1442 to one bonding pad 1430 in bonding layer 1446, to reduce the number of signal lines and the number of bumps 1410 used for transmitting the signals. FIG. 14B shows one signal line 1428 connected with two or more TFTs 1422 for two or more micro-LEDs 1420.

Backplane 1406 may include a silicon wafer including transistors, interconnects, and other circuits formed thereon to implement, for example, CMOS circuits 1408. As described above, CMOS circuit 1408 may include, for example, CMOS transistors, interconnect layers (e.g., metal layers), vias, and bonding pads 1432. Bonding pads 1432 may be connected to bonding pads 1430 on thin-film circuit layer 1404 by bump 1410.

As described above, to achieve a good display quality, the drive circuits and the periphery circuits for operating a micro-LED array may need to meet certain specifications. For example, in order to display images with sufficient number of brightness levels, it is desirable that the capacity and the density of bitcells in the local memory (e.g., SRAM) for storing display data be high. When all drive circuits are fabrication on a silicon backplane, the capacity of the bitcells in the local memory may be constrained by the design of the pixel circuits, the process technology (e.g., certain physical design rules), and the limited silicon area for the bitcells in each pixel.

In addition, the drive circuits may need to deliver low-variation analog drive currents to the micro-LEDs to avoid brightness variations. However, due to the variability of the micro-LED drive transistors (e.g., caused by the random dopant fluctuation and the small size of each micro-LED drive transistor), the drive current and therefore the brightness may vary significantly among the micro-LEDs or over time. The brightness variation may be visible to user's eyes and thus may affect the user experience. To compensate the variability of the micro-LED drive transistors, analog calibration signals for the pixels may be determined during a calibration process, and may be loaded into individual drive circuits before turning on the micro-LEDs such that the drive circuits may use the analog calibration signals to provide appropriate drive currents to the micro-LEDs. In CMOS circuits, the leakage current may be high, in particular, when the feature sizes of the components are small. Due to the high leakage of the drive circuits, the analog calibration signals may need to be loaded into the drive circuits periodically (e.g., at a frame rate) in order to maintain the correct signal levels of the analog calibration signals in the drive circuits.

Furthermore, as described above with respect to, for example, FIGS. 6, 11, and 13, the drive circuits for micro-LEDs may include various types of circuits, such as column and row drivers, comparators, PWM latches, counters, memory cells, current drivers, passive components (e.g., resistors and capacitors), and the like. These circuits may include high-speed digital circuits, analog circuits, and memory cells, which may have different performance requirements (e.g., speed, power consumption, leakage current, and signal accuracy), different operation conditions (e.g., different supply voltages), and different fabrication challenges (e.g., density, feature size, and variation tolerance). For example, the digital circuits may include high density SRAM cells, comparators, and PWM latch circuits that may operate at high speeds and low supply voltages (e.g., less than about 1.2 V or 1 V), while the analog circuits may include larger transistors that operate at medium or high supply voltage (e.g., greater than about 2 V or higher) and can provide high drive currents. It is difficult to optimize both the low-voltage digital circuits and the medium-voltage (or high-voltage) analog circuits on a same wafer using a same process flow. For example, process technologies used to fabricate high density, high speed, low voltage, and low power consumption digital circuits may not be suitable for making analog circuits that have low leakage currents, large voltage swing, and low performance variation.

When all drive circuits are fabrication on a same silicon backplane, transition regions and/or spacing may be needed between the different types of circuits (e.g., SRAM cells, digital circuits, analog circuits, and high voltage circuits) in each pixel and between pixels. Thus, a large portion of the pixel area may be used as the transition regions or the spacing between the different types of circuits. Therefore, the number of local memory cells that can fit in each pixel may be limited. For example, in embodiments where each pixel has its own drive circuits, a 2-um pixel may be able to accommodate about 6 physical bitcells, while a 1.8-um pixel may only be able to accommodate about 4 physical bitcells, in a 28-nm CMOS technology. Optimizing the layout design may help to reduce the transition regions, but may not eliminate the transition regions to make more space for additional circuits (e.g., more bitcells) because transition regions are still needed between different types of circuits.

According to certain embodiments, a display device may include a micro-LED wafer (e.g., a compound semiconductor wafer such as a III-V semiconductor wafer), a silicon wafer including digital circuits fabricated thereon, and an indium-gallium-zinc-oxide (IGZO) layer including analog drive circuits fabricated therein. The IGZO layer may be between the micro-LED wafer and the silicon wafer, and may be fabricated in a separate process on the micro-LED wafer, the silicon wafer, or another wafer (e.g., a glass substrate, a polyimide substrate, or a semiconductor substrate). The separation of the digital drive circuits and the analog drive circuits may allow for the optimization of the digital drive circuits and the analog drive circuits using different processing technologies. For example, the digital drive circuits on the silicon wafer can be designed and fabricated using the state-of-art digital design and processing technology, while the analog drive circuits, such as thin-film transistors (TFTs), may be fabricated in the IGZO layer to achieve low leakage currents, high voltage sustainability, low variability, and small dimensions. In some embodiments, the analog drive circuits may be fabricated in another material layer (different from IGZO) that can be used to make analog drive circuits with low leakage currents, high voltage sustainability, low variations, and small dimensions. Examples of such materials include low-temperature polycrystalline silicon (LTPS), amorphous silicon (a-Si), and the like.

The low-leakage of the analog drive circuits in the IGZO layer may allow for more accurate storage of analog display data of different voltage levels for analog driving, which may increase the bit depth or color depth of each pixel. For example, n SRAM cells per pixel may provide n-bit digital color depth ($2^n$ brightness levels) for each pixel, while different levels of analog voltage signals stored in the analog drive circuits may provide additional m-bit analog color depth ($2^m$ brightness levels), such that the total color depth of each pixel may be about n+m bits. Additionally or alternatively, the analog driving scheme may be used for pixel calibration, where the calibrated analog signal for each pixel may be loaded into an analog storage device (e.g., a capacitor) and may remain constant in the analog storage device for a long time period (e.g., >1 second, >10 seconds, >100 seconds, or >200 seconds) due to the low leakage of the analog drive circuits in the IGZO layer. Therefore, the calibrated analog signal for each pixel can be refreshed at a frequency much lower than the frame rate, and thus the power consumption of the analog drive circuits can be significantly reduced.

Because the analog drive circuits are not fabricated on the silicon wafer, the silicon wafer may have room for more memory cells for each pixel. The silicon wafer may also have room for other circuits, such as real-time calibration circuits or design-for-test circuits. In some embodiments, due to the separation of the digital drive circuits and the analog drive circuits using different wafers, the IGZO layer may also have more room for additional circuits. For example, in-pixel compensation circuits may be implemented in the IGZO layer to compensate threshold voltage ($V_{th}$) and/or mobility ($\mu$) variations, such that the drive current may be independent of the threshold voltage of the analog drive transistor. Due to the in-pixel compensation, the calibration of the pixels may become much easier or simpler.

FIG. 15A illustrates an example of a pixel 1500 in an example of a display device according to certain embodiments. Pixel 1500 may include CMOS circuits 1510, an IGZO layer 1520, and a micro-LED 1530 arranged in a stack (e.g., a vertical stack along the z direction). CMOS circuits 1510 may include digital circuits and memory devices, and may operate at a low supply voltage (e.g., equal to or less than about 1.5 V or 1 V). IGZO layer 1520 may include analog circuits and may operate at a medium or high voltage level (e.g., between about 2 V and about 5 V or higher). Pixel 1500 may also include voltage level shifting circuits at the interfaces between the digital circuits and the analog circuits. The voltage level shifting circuits may be in CMOS circuits 1510, IGZO layer 1520, or both. Micro-LED 1530 may include a micro-LED that may emit light in red, green, or blue color as described, for example, with respect to FIGS. 7A-10.

In some embodiments, CMOS circuits 1510, IGZO layer 1520, and micro-LED 1530 may be separately fabricated on different substrates using different fabrication processes, and may then be integrated together. For example, CMOS circuits 1510 may be fabricated on a silicon substrate using processing technologies for fabricating digital circuits and/or memory devices (e.g., SRAM). Micro-LED 1530 may be fabricated on a semiconductor wafer or another wafer as described above with respect to FIGS. 7A-10. IGZO layer 1520 may be fabricated on an IGZO layer deposited on the silicon wafer or the wafer including micro-LED 1530, or may be fabricated on another substrate, such as a polyimide substrate, a glass substrate, another oxide substrate, or another semiconductor substrate. As described above, the analog circuits in the IGZO layer may include thin-film circuits formed by depositing dielectric layers, uniform, amorphous thin films of active semiconductor having high carrier mobility, and metallic contacts over a supporting substrate (e.g., non-conducting). For example, the IGZO layer may include c-axis aligned crystal indium-galliumzinc oxide (CAAC-IGZO), amorphous indium gallium zinc oxide (a-IGZO), zinc oxide, and the like. In some embodiments, IGZO layer 1520 may be attached to CMOS circuits 1510 and/or micro-LED 1530 using bonding pads or metal bumps as described above.

FIG. 15B illustrates a block diagram of an example of pixel 1500 in a display device according to certain embodiments. In the illustrated example, CMOS circuits 1510 may include memory devices (e.g., SRAM cells 1512) for storing display data, as described above with respect to memory device 1102. CMOS circuits 1510 may also include a comparator 1516, which may be similar to comparator 1104 described above and may be used to compare a clock counter value with the display data stored in SRAM cells 1512 to generate a high or low output signal based on the comparison result. CMOS circuits 1510 may further include a PWM latch 1514, which may be similar to PWM latch circuit 1106 described above and may be used to generate PWM signals for modulating the micro-LED drive current. In some embodiments, PWM latch 1514 may terminate the PWM output pulses based on outputs signals from, for example, comparator 1516. Because analog drive circuits are not fabricated on the silicon wafer, there may be more room to fit more SRAM cells and/or other circuits (e.g., design-for-test circuits) for each pixel in CMOS circuits 1510.

IGZO layer 1520 may include analog drive circuits for micro-LED 1530. The analog drive circuits fabricated in the IGZO layer can have very low leakage. In the illustrated example, IGZO layer 1520 may include a level shifter 1525 at the interface between low-voltage digital circuits and medium-voltage analog circuits. As described above, in some embodiments, level shifter 1525 may be implemented in CMOS circuits 1510. The analog drive circuits shown in FIG. 15B may include a 2T1C pixel structure that includes two transistors T1 (1522) and T2 (1524), and a capacitor 1528 for storing an analog signal for the pixel (e.g., analog display data or analog calibration signal for the pixel). The analog signal may be stored at capacitor 1528 or the gate of transistor T2 (1524) through transistor T1 (1522) when the scan signal is active. The analog signal at the gate of transistor T2 (1524) may control the IDS of transistor T2 (1524), which is supplied to micro-LED 1530 as the drive current for micro-LED 1530. Because of the low leakage of the analog drive circuits in IGZO layer 1520, the analog signal stored in capacitor 1528 (and at the gate of transistor T2) may remain constant for a long period of time, such as a few seconds, a few tens of seconds, or a few hundreds of seconds (e.g., about 200 seconds at 85° C. for devices with channel lengths about 65 nm). Therefore, the analog signal may not need to be reloaded to the 2T1C pixel structure in each image frame. As such, the power consumption of the pixel may be reduced.

A third transistor 1526 may be controlled by the output of comparator 1516 (e.g., through level shifter 1525) to provide the drive current from transistor T2 (1524) to an anode 1521 of micro-LED 1530, or to disconnect anode 1521 of micro-LED 1530 from the 2T1C pixel structure. In some embodiments, for each image frame, third transistors 1526 for micro-LEDs in a same row or column may be turned on at the same time, such that the micro-LEDs on the row or column may receive drive current and start to emit light at about the same time. Third transistors 1526 for micro-LEDs in a row or column may be turned off individually and independently by respective PWM signals generated by comparators 1516 and PWM latches 1514 based on a clock counter value and respective display data stored in SRAM cells 1512.

Micro-LED 1530 may include a light-emitting diode 1532 that may emit red, green, or blue light in an active region (e.g., a quantum well or a multi-quantum well). Micro-LED 1530 may share a common cathode or a common anode with other micro-LEDs on the micro-LED wafer. The perceived brightness of the emitted light from micro-LED 1530 may be controlled by the drive current and/or the duration of the light emission. Due to manufacture variations in the analog drive circuits and micro-LEDs 1530, the analog drive voltage at the gate of transistor T2 (and thus the drive current) to achieve a certain light emission intensity may be different from pixel to pixel. Therefore, the analog drive voltage (and thus the drive current) of each pixel in the display device may need to be calibrated in order to appropriately drive the micro-LEDs to achieve a uniform maximum brightness or light intensity. The calibrated maximum analog drive voltage may be stored, and may be reloaded into the pixel periodically to refresh the analog drive voltage for each pixel.

In some embodiments, because the analog drive voltage can be more accurately stored in capacitor 1528, one-bit or multiple-bit (e.g., m-bit) analog data represented by an analog voltage signal at one of multiple levels (e.g., two or more levels) may be loaded into each pixel, and the analog drive current generated using the m-bit analog data may be further modulated using the PWM signals generated using n-bit digital data stored in n SRAM cells to achieve $2^{n+m}$ intensity levels (i.e., a color depth of n+m bits).

As shown in FIG. 15B, there may be only one connection between CMOS circuits 1510 and the analog drive circuits for each pixel. In some embodiments, other circuits, such as shared data lines, shared control lines, address decoders, multiplexors, and switches, may be used to reduce the total number of connections between the silicon wafer and the IGZO layer as described above with respect to FIGS. 12-14.

Figure 16:
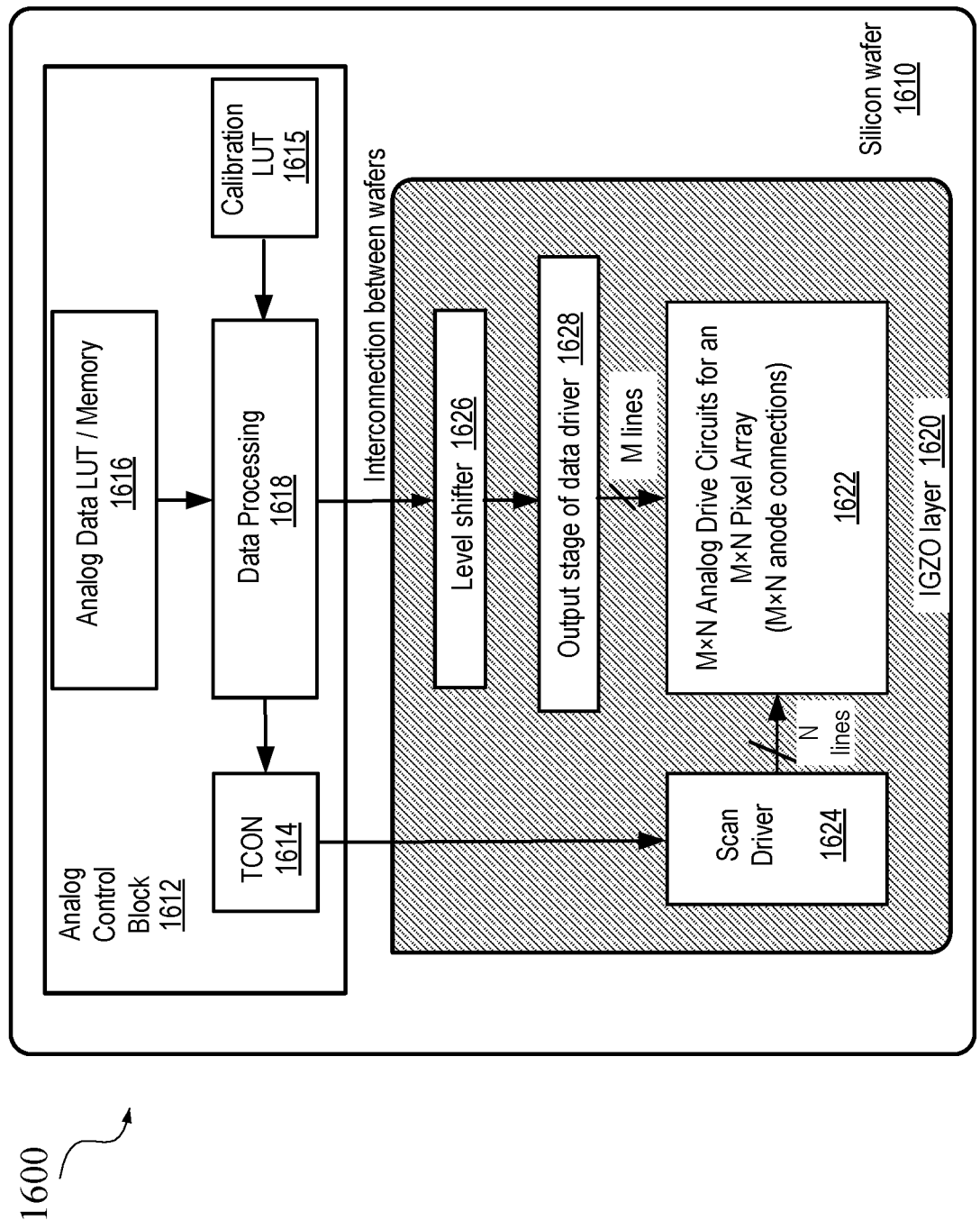
FIG. 16 includes a block diagram illustrating electrical circuits of an example of a display device according to certain embodiments.

FIG. 16 includes a block diagram illustrating electrical circuits of an example of a display device 1600 according to certain embodiments. In the illustrated example, the electrical circuits of display device 1600 may include digital circuits fabricated on a silicon wafer 1610 and analog circuits fabricated in an IGZO layer 1620 bonded or otherwise coupled to silicon wafer 1610. IGZO layer 1620 may be bonded or otherwise coupled to a micro-LED wafer (not shown in FIG. 16). FIG. 16 shows that the digital circuits on silicon wafer 1610 may include an analog control block 1612. Silicon wafer 1610 may also include other digital circuits, such as SRAM cells, comparators, and PWM latches described above, which are not shown in FIG. 16.

Analog control block 1612 may include a time control circuit 1614 that may be used to synchronize digital circuits and analog circuits. Analog control block 1612 may also include an analog data LUT 1616 (or analog data memory) for storing analog calibration data for compensating variations between pixels as described above. In some embodiments, analog control block 1612 may also include a calibration LUT 1615, which may store calibration data for compensating variations during operations, such as variations caused by aging, temperature increase, or other changes in the operating condition. The analog calibration data stored in analog data LUT 1616 and the calibration data stored in calibration LUT 1615 may be used by a data processing circuit 1618 to generate analog drive signals for the pixels, which may be provided to the analog drive circuits of the pixels (e.g., the 2T1C pixel structure shown in FIG. 15B).

Analog circuits on IGZO layer 1620 may include, for example, level shifters 1626 for shifting the analog drive signals from data processing circuit 1618 and sending the level-shifted analog drive signals to the output stage of analog data driver 1628. A scan driver 1624 may be used to select the analog drive circuits for a row of pixels at a time. The output stage of analog data driver 1628 may provide the analog drive signals to the row of pixels selected by scan driver 1624. For example, in a display device with M×N pixels, the analog circuits on IGZO layer 1620 may include an M×N array of analog drive circuits. Each of the M×N analog drive circuits may be used to drive one micro-LED in one pixel of the M×N pixels, and may include, for example, the analog drive circuits shown in FIG. 15B above and FIGS. 17-24 below. Scan driver 1624 may drive N lines and may select one row of analog drive circuits at a time from the N rows of analog drive circuits. The output stage of analog data driver 1628 may drive M lines to provide the analog drive signals to M analog drive circuits at a time, where the M analog drive circuits are on a same row selected by scan driver 1624 and are in M different columns in the M×N arrays of analog drive circuits.

Figure 17:
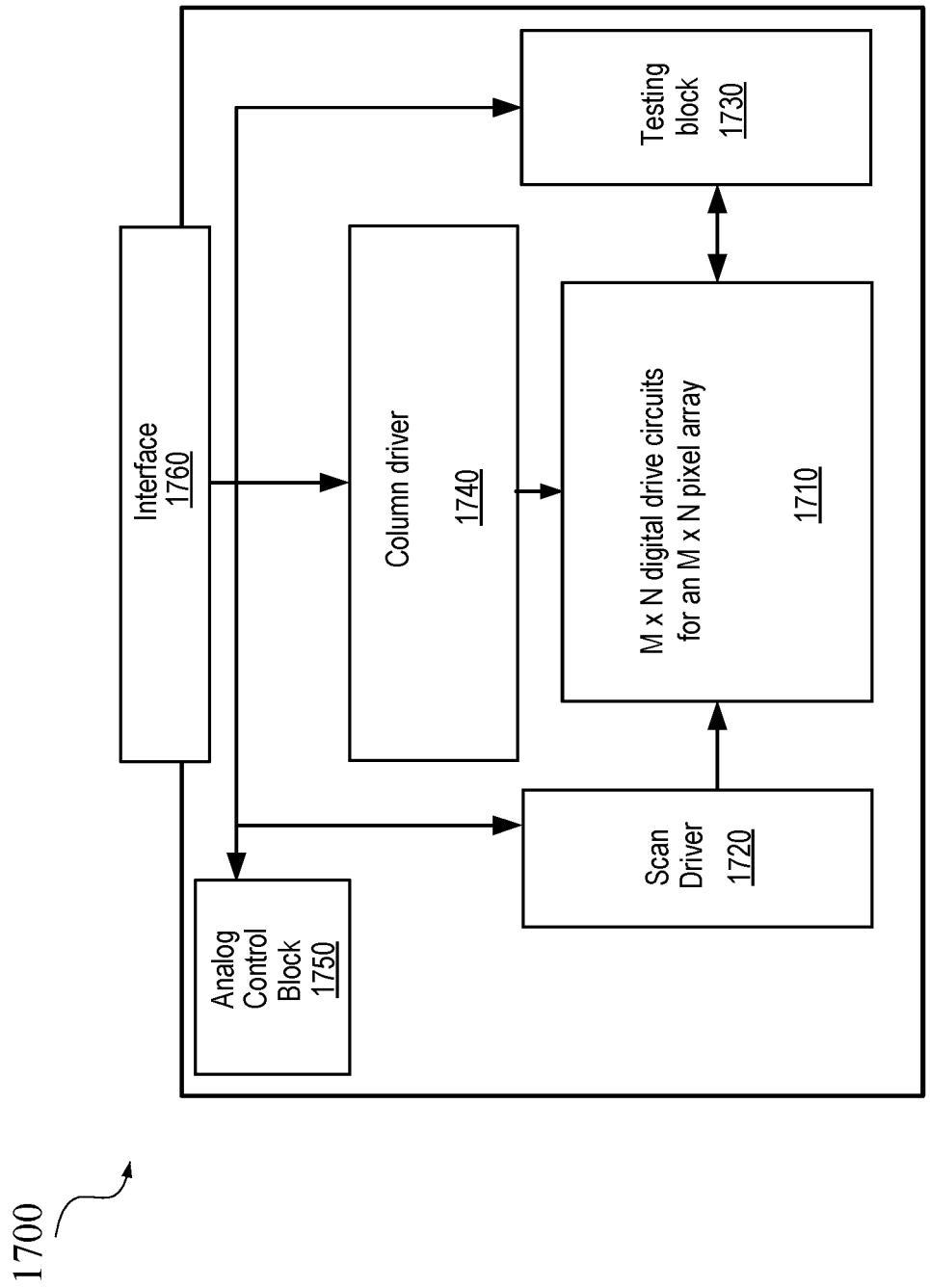
FIG. 17 includes a block diagram illustrating CMOS digital circuits on an example of a silicon wafer of a display device according to certain embodiments.

FIG. 17 includes a block diagram illustrating CMOS digital circuits 1700 on a silicon wafer of an example of a display device according to certain embodiments. In addition to an analog control block 1750 (which may be similar to analog control block 1612), CMOS digital circuits 1700 on the silicon wafer may include an M×N array of digital drive circuits 1710 for an M×N array of pixels. Each of the M×N digital drive circuits may be used to drive one pixel of the M×N pixels, and may include, for example, n SRAM cells, a comparator, and a PWM latch as described above with respect to FIG. 11 or FIG. 15B. CMOS digital circuits 1700 on the silicon wafer may also include other digital circuits, such as a scan driver 1720 and a column driver 1740 for selectively activating the M×N array of digital drive circuits for the M×N pixels, for example, one row at a time. CMOS digital circuits 1700 on the silicon wafer may also include an interface 1760 for interfacing with peripheral circuits or other circuits, such as receiving display data of image frames from an image processing or image rendering device (e.g., a graphic processing unit), as shown in, for example, FIG. 11. In some embodiments, CMOS digital circuits 1700 on the silicon wafer may also include a testing block 1730. Testing block 1730 may include design-for-test circuits for testing other digital circuits in CMOS digital circuits 1700, and/or may include circuits for real-time calibration of the display device.

Figure 18:
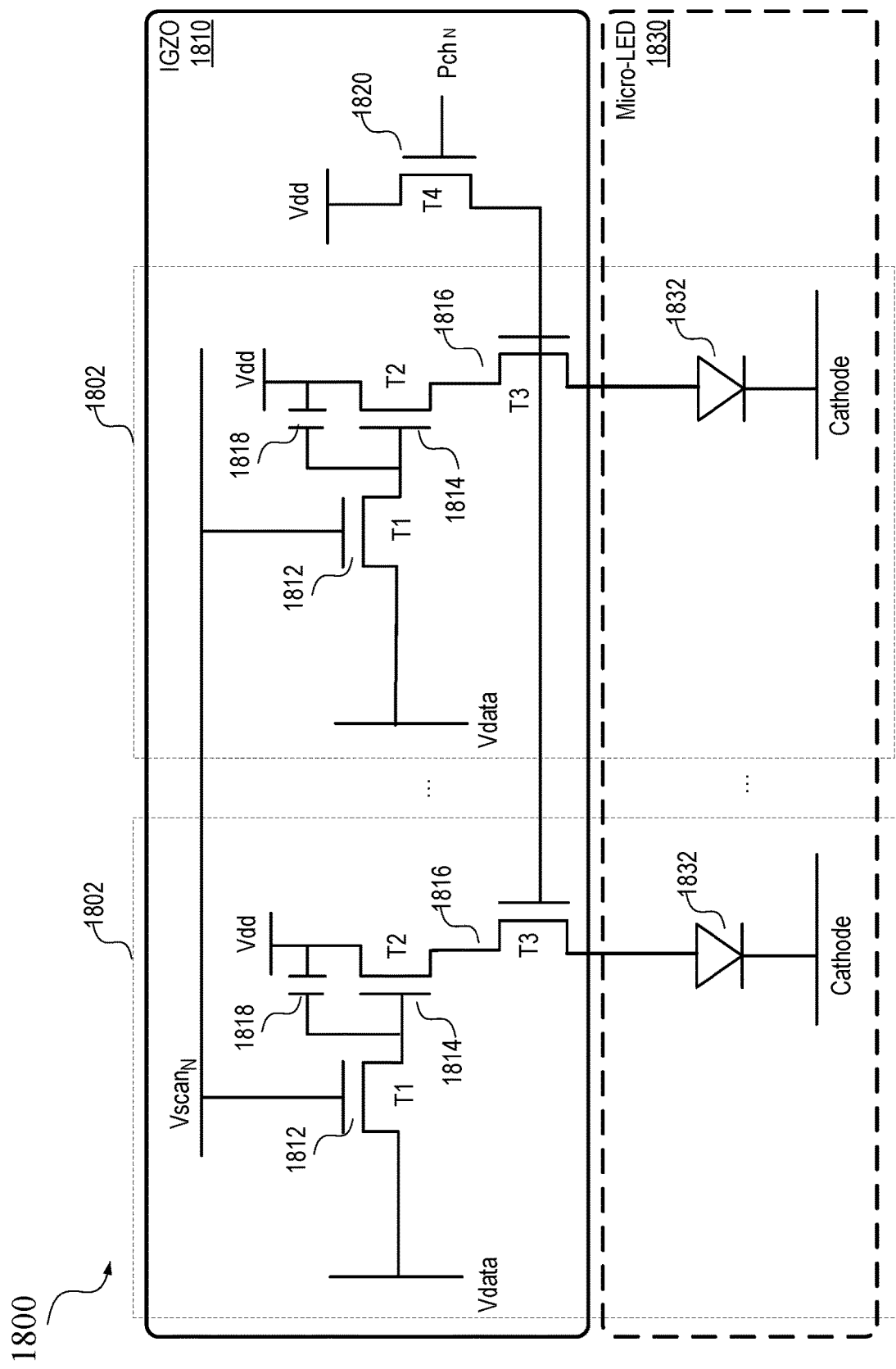
FIG. 18 illustrates examples of analog drive circuits on an indium-gallium-zinc-oxide (IGZO) layer in an example of a display device according to certain embodiments.

FIG. 18 illustrates examples of analog drive circuits on an IGZO layer 1810 in an example of a display device 1800 according to certain embodiments. In the illustrated example, two analog drive circuits for two pixels 1802 in a same row of a pixel array are shown. As described above with respect to FIG. 15B, the analog drive circuits shown in the example may include, for each pixel 1802, a switch implemented using a transistor T3 (1816), and a 2T1C pixel structure that includes a first transistor T1 (1812), a second transistor T2 (1814), and a capacitor 1818. The switch may be used to control the emission time (e.g., "ON" time) of the corresponding micro-LED 1832 on micro-LED wafer 1830. In one example, the supply voltage for the analog circuits on IGZO layer 1810 may be about 2.5 V.

M analog drive signals for M pixels 1802 in a same row N may be loaded into capacitors 1818 of the M analog drive circuits through M Vdata lines and a Vscan$_N$ signal. As described above, the analog drive signals may include analog calibration signals for achieving a uniform display intensity, and/or may include analog gray-scale levels representing analog display data for achieving a higher color depth. The analog drive signal for each pixel 1802 may control the drive current that may pass through transistor T3 to drive the corresponding micro-LED 1832. As also described above, the analog drive signals may not need to be reloaded for each display image frame because of the low leakage of the analog drive circuits in IGZO layer 1810. For each display image frame, the M pixels 1802 in a same row may be turned on to emit light at the same time by turning on the corresponding transistors T3 (1816) at the same time using a common control signal Pch$_N$ and one or more transistors T4 (1820). The M pixels 1802 in a same row may be turned off individually by the digital drive circuits (e.g., the PWM latch and the comparator) according to the digital display data for pixels 1802 of the display image frame (e.g., stored in SRAM cells) as described above and below.

Figure 19:
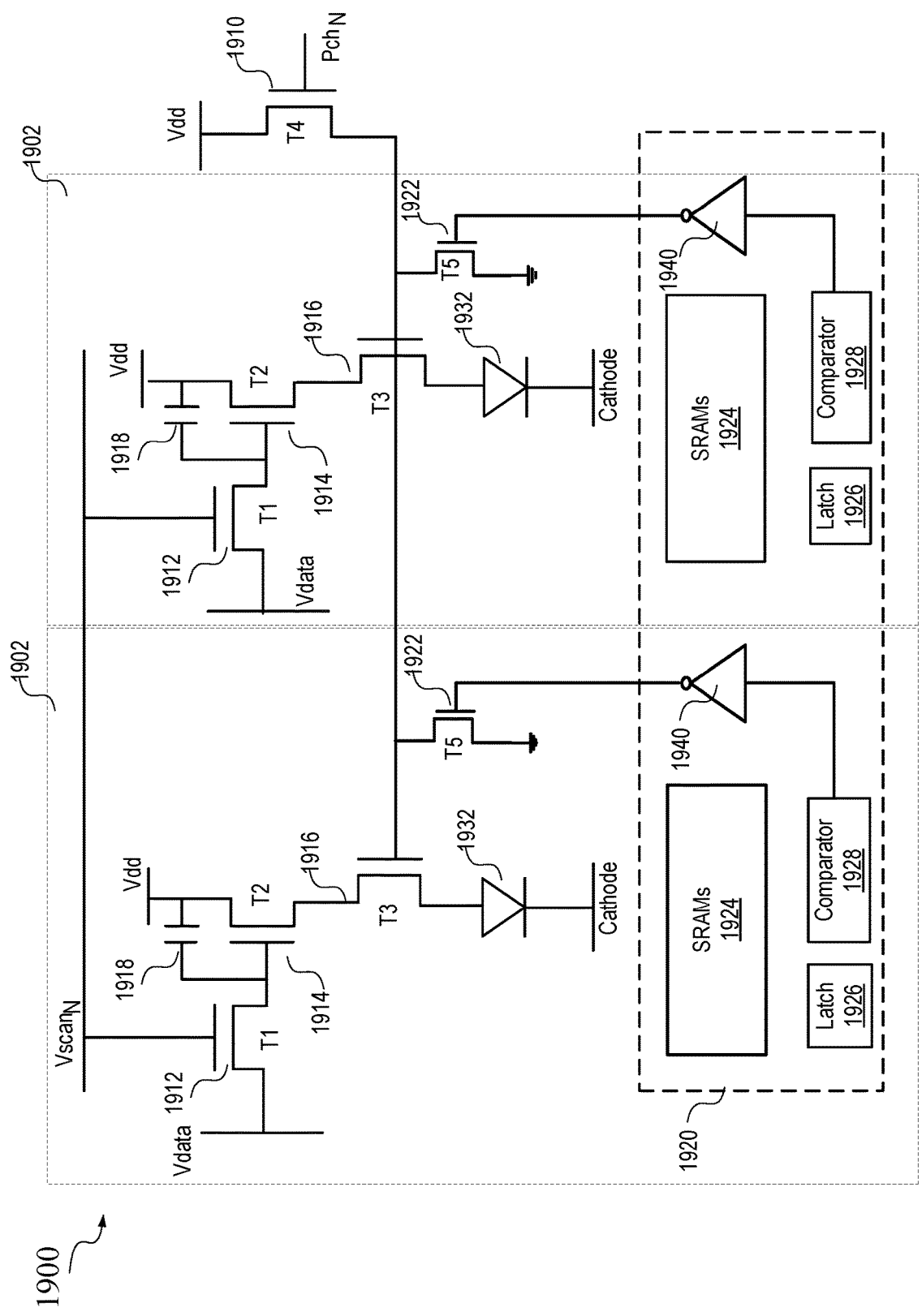
FIG. 19 illustrates digital drive circuits and analog drive circuits in an example of a display device according to certain embodiments.

FIG. 19 illustrates digital drive circuits and analog drive circuits in an example of a display device 1900 according to certain embodiments. Display device 1900 may include digital drive circuits 1920 formed on a silicon substrate, analog drive circuits formed in an IGZO layer, and micro-LEDs 1932 fabricated in compound semiconductor layers. In the illustrated example, digital and analog drive circuits of two pixels 1902 in a same row of a pixel array are shown. As described above, the digital drive circuit in a pixel 1902 may include, for example, SRAM cells 1924, a latch 1926, and a comparator 1928. The analog drive circuit in each pixel 1902 may include, for example, a transistor T1 (1912), a transistor T2 (1914), a transistor T3 (11916), and a capacitor 1918. Analog drive signals for M pixels 1902 in a same row N may be loaded into corresponding capacitors 1918 through M Vdata lines and a Vscan$_N$ signal. The analog drive signals may include analog calibration signals for achieving a uniform display intensity in the pixel array, and/or may include analog gray-scale levels representing analog display data for achieving a higher color depth. The analog drive signal for each pixel 1902 may control the drive current that may pass through transistor T3 to drive the corresponding micro-LED 1932. As described above, the analog data may not need to be reloaded in each display image frame because of the low leakage of the analog drive circuits in the IGZO layer.

For each display image frame, pixels 1902 in a same row may be turned on to emit light at the same time by turning on the corresponding transistors T3 (1916) at the same time using a common control signal Pch$_N$ and one or more transistors T4 (1910). In some embodiments, transistor T4 (1910) may have a high drive capability and may be used to turn on the switches (e.g., transistors T3) in multiple pixels 1902. In some embodiments, the analog drive circuit in each pixel 1902 may include a transistor T4 (1910). In some embodiments, to display an image pixel with a zero intensity level, the supply voltage (e.g., Vdd) connected to transistor T4 (1910) in the corresponding pixel 1902 may be switched off, disconnected, or set to a low level, such that transistor T3 (1916) of the analog drive circuit for the corresponding pixel 1902 may be turned off, thereby avoiding a short pulse that may otherwise be caused by a difference between the turn-on time of the pixels in the row and the turn-off time of the pixel that needs to have a zero intensity level.

Pixels 1902 in a same row may be turned off individually or independently by the digital drive circuits (e.g., the PWM latch and the comparator) according to the digital display data for the pixels of the display image frame (e.g., stored in SRAM). In the illustrated example, a pull-down transistor T5 (1922) may be used to pull down the voltage level at the gate of transistor T3 (1916) to turn off transistor T3 (1916), thereby turning off the micro-LED 1932 in the corresponding pixel 1902. Transistor T5 (1922) may be controlled by an output signal from the digital drive circuit in the corresponding pixel 1902.

As described above, the analog drive circuits in the IGZO layer and the digital drive circuits on the silicon wafer may have different operating supply voltages. Thus, a level shifter may be used between the analog drive circuits in the IGZO layer and the digital drive circuits on the silicon wafer. In the example shown in FIG. 19, an inverter 1940 may be used as the level shifter between the output of comparator 1928 and the gate of transistor T5 (1922). Inverter 1940 may be on the silicon wafer or in the IGZO layer. To turn on transistor T5 (1922) and pull down the gate voltage of transistor T3 (1916), comparator 1928 may need to send a low output signal (e.g., about 0 V), such that inverter 1940 may output a high output signal to the gate of transistor T5 (1922).

Figure 20:
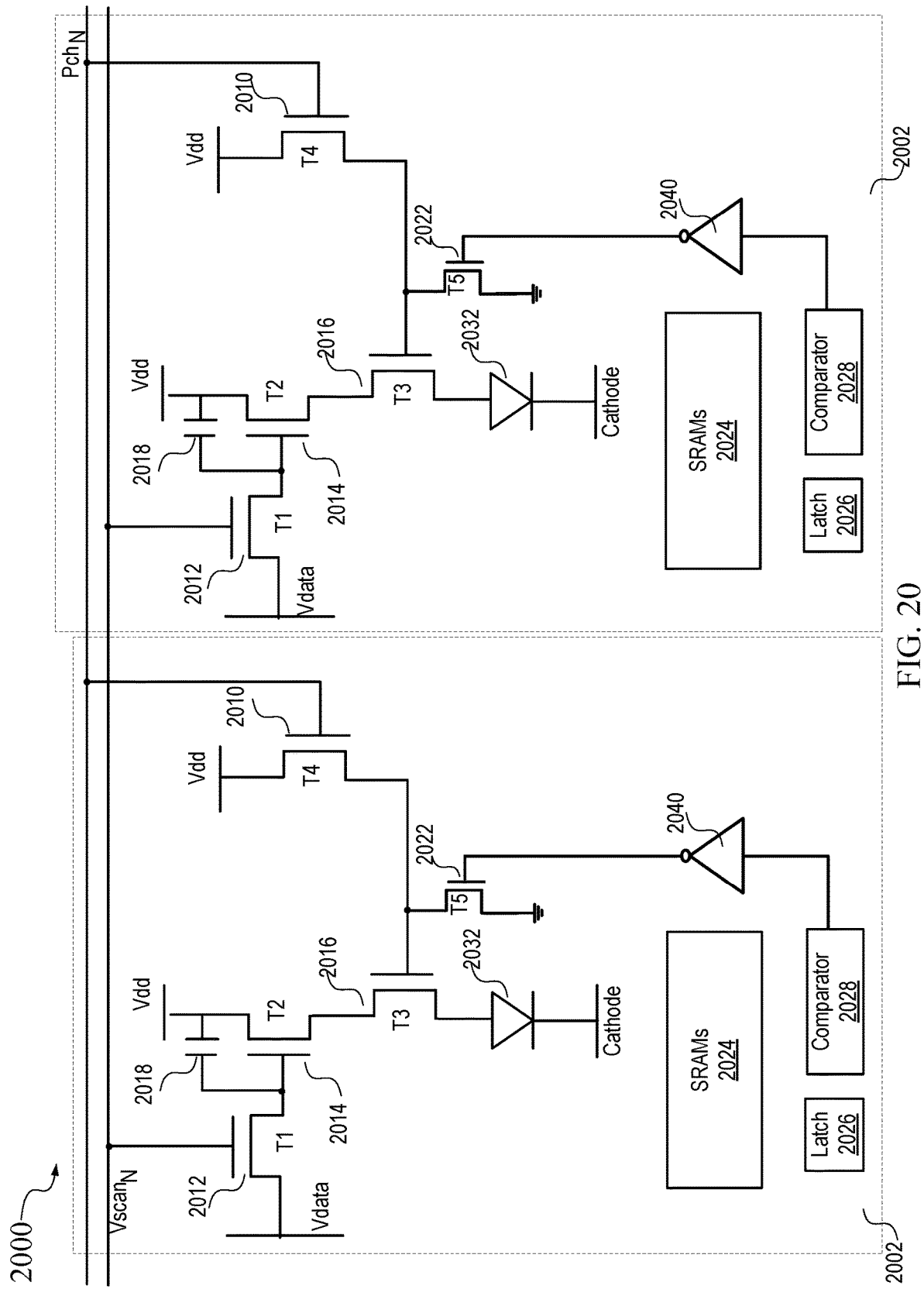
FIG. 20 illustrates analog and digital drive circuits in an example of a display device according to certain embodiments.

FIG. 20 illustrates analog and digital drive circuits in an example of a display device 2000 according to certain embodiments. Display device 2000 may be similar to display device 1900 and may include digital drive circuits 2020 on a silicon substrate, analog drive circuits formed in an IGZO layer, and micro-LEDs 2032 fabricated in compound semiconductor layers. In the illustrated example, digital and analog drive circuits of two pixels 2002 in a same row of a pixel array are shown. As described above, the digital drive circuit in each pixel 2002 may include, for example, SRAM cells 2024, a latch 2026, and a comparator 2028. The analog drive circuit in each pixel 2002 may include, for example, a transistor Ti (2012), a transistor T2 (2014), a transistor T3 (2016), a transistor T4 (2010), a transistor T5 (2022), and a capacitor 2018. M analog drive signals for M pixels 2002 in a same row N may be loaded into corresponding capacitors 2018 through M Vdata lines and a Vscan$_N$ signal. The analog drive signals may include analog calibration signal for achieving a uniform display intensity in the display device, and/or may include analog gray-scale levels representing analog display data for achieving a higher color depth. The analog drive signal for each pixel may control the drive current that may pass through transistor T3 to drive the corresponding micro-LED 2032. The analog drive signal may not need to be reloaded in each display image frame due to the low leakage of the analog drive circuits in the IGZO layer.

For each display image frame, pixels 2002 in a same row may be turned on to emit light at the same time by turning on the corresponding transistors T3 (2016) at the same time using a common control signal Pch$_N$ that controls the transistor T4 (2010) in each pixel 2002. In some embodiments, to display an image pixel with a zero intensity level, the supply voltage (e.g., Vdd) connected to transistor T4 (2010) of the corresponding pixel may be switched off, disconnected, or set to a low level, such that transistor T3 (2016) of the analog drive circuit in the corresponding pixel 2002 may be turned off, thereby avoiding a short pulse that may otherwise be caused by a difference between the turn-on time of pixels 2002 in the row and the turn-off time of the pixel 2002 that needs to have a zero intensity level.

Pixels 2002 in a same row may be turned off individually and/or independently by the digital drive circuits (e.g., the PWM latch and the comparator) according to the digital display data for the pixels of the display image frame (e.g., stored in SRAM). In the illustrated example, transistor T5 (2022) may be used to pull down the voltage level at the gate of transistor T3 (2016) to turn off transistor T3 (2016), thereby turning off the corresponding micro-LED 2032.

Transistor T5 (2022) may be controlled by an output signal from the digital drive circuits for the pixel 2002.

As described above, the analog drive circuits in the IGZO layer and the digital drive circuits on the silicon wafer may have different operating supply voltage. Thus, a level shifter may be used between the analog drive circuit in the IGZO layer and the digital drive circuit on the silicon wafer. In the example shown in FIG. 20, an inverter 2040 may be used as the level shifter between the output of comparator 2028 and the gate of transistor T5 (2022). Inverter 2040 may be on the silicon wafer or in the IGZO layer. To turn on transistor T5 (2022) and pull down the voltage at the gate of transistor T3 (2016) (thus turning off transistor T3), comparator 2028 may send a low output signal (e.g., about 0 V), and inverter 2040 may output a high output signal to the gate of transistor T5 (2022).

The 2T1C analog drive circuit described above may suffer from threshold voltage (V$_{th}$) and mobility (μ) variations that may be different for different pixels. In some embodiments, in-pixel compensation for the analog drive circuits may be implemented in the IGZO layer to compensate for the threshold voltage (V$_{th}$) and mobility (μ) variations. The in-pixel compensation may be used as an alternative or an addition to the analog data calibration. When the in-pixel compensation is used in addition to the analog data calibration, the analog calibration of the pixels can be much simpler and easier.

Figure 21:
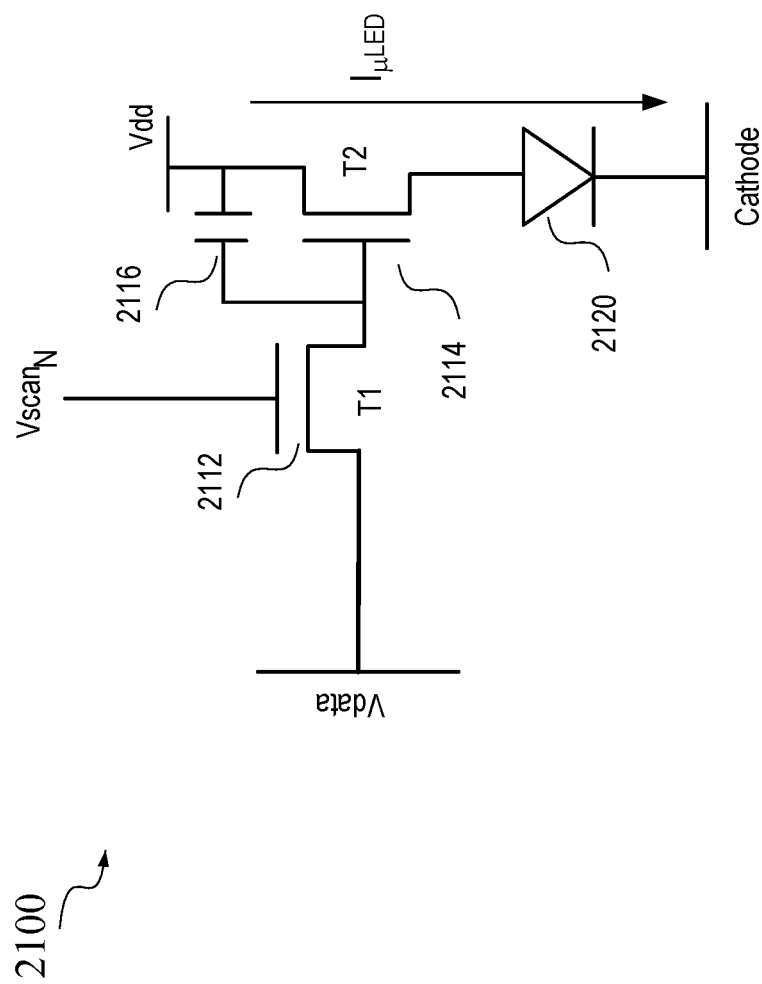
FIG. 21 illustrates an example of a 2T1C analog drive circuit in a display device according to certain embodiments.

FIG. 21 illustrates an example of a 2T1C analog drive circuit in a display device 2100 according to certain embodiments. As described above, the 2T1C analog drive circuit may include two transistors T1 (2112) and T2 (2114) and a capacitor 2116 for storing analog data (e.g., analog calibration signal) for the pixel. The analog data may be stored at capacitor 2116 or the gate of transistor T2 (2114) through transistor T1 (2112) when a scan signal Vscan$_N$ is asserted (e.g., set to a high level). The voltage at the gate of transistor T2 (2114) may control the current that flows through transistor T2 (2114) and a corresponding micro-LED 2120. More specifically, a current I$_{μLED}$ that flows through micro-LED 2120 may be approximately determined according to:

$$I_{\mu LED} = \frac{W\mu C_{ox}}{2L}(V_{GS} - V_{th})^2,$$

where V$_{th}$ is the threshold voltage of transistor T2 (2114), V$_{GS}$ is the voltage difference between the gate and the source of transistor T2 (2114), W is the width of transistor T2 (2114) (e.g., the width of the channel of transistor T2), L is the length of the channel of transistor T2 (2114), C$_{ox}$ is the capacitance of the gate oxide of transistor T2 (2114), and is the mobility of the carriers (e.g., electrons) in transistor T2 (2114). Due to manufacturing variations (e.g., doping density variations and gate capacitance variations) and changes in operating conditions (e.g., temperature), the threshold voltage V$_{th}$ may vary from device to device and may vary during the operation. Therefore, the drive current for driving micro-LED 2120 may also vary from device to device and/or may vary during the operation.

According to certain embodiments, in-pixel compensation for the analog drive circuits may be implemented in the IGZO layer to compensate the threshold voltage (V$_{th}$) and/or mobility (μ) variations, such that the drive current may be independent of the threshold voltage of the analog drive transistor.

Figures 22A, 22B:
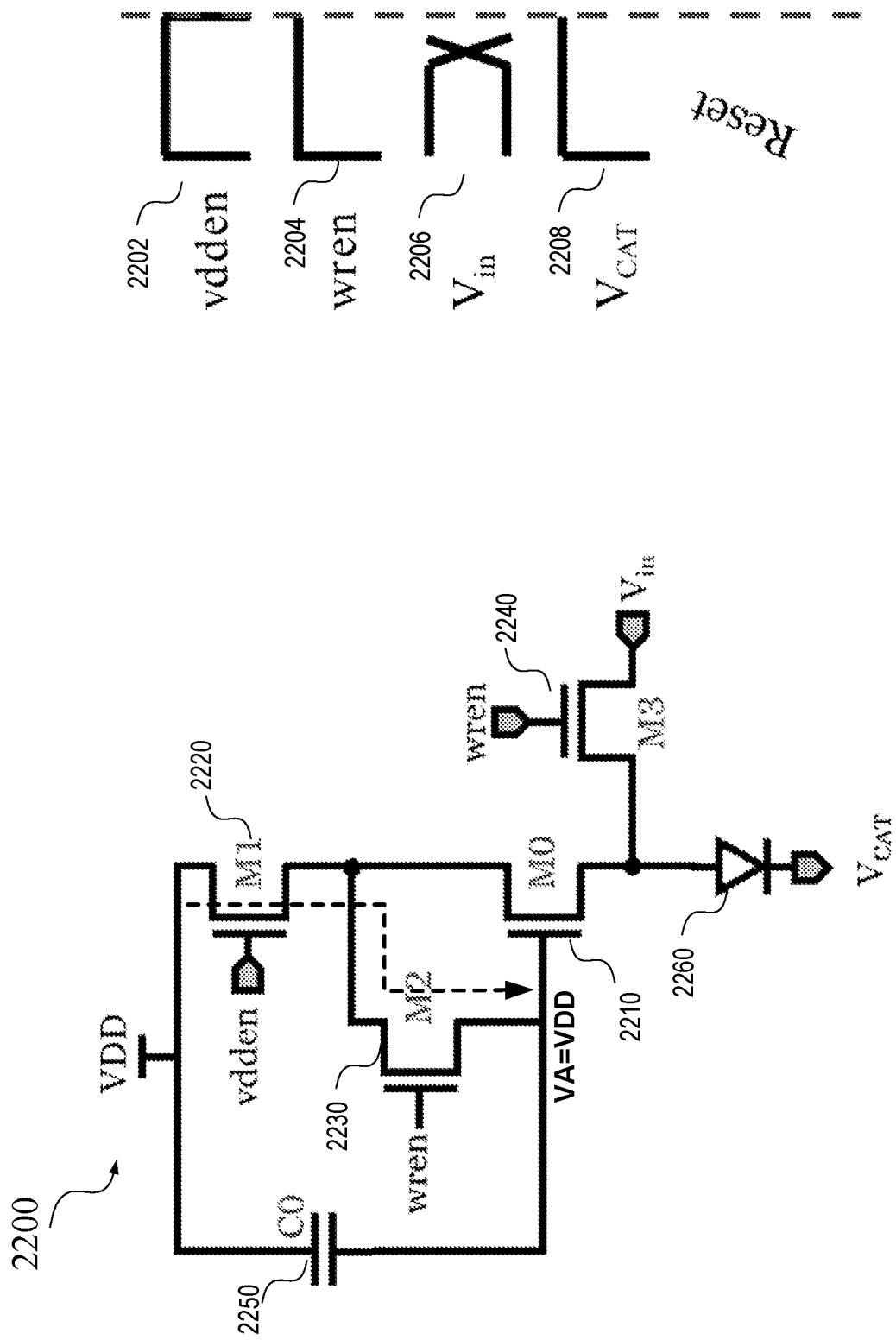
FIG. 22A illustrates an example of an analog drive circuit with threshold voltage compensation in an example of a display device according to certain embodiments.
FIG. 22B illustrates examples of voltage signals at various nodes of the analog drive circuit of FIG. 22A in a reset mode.

FIG. 22A illustrates an example of an analog drive circuit with threshold voltage compensation capability in an example of a display device 2200 according to certain embodiments, where the analog drive circuit is in a reset mode to reset an analog storage device to a certain voltage level (e.g., VDD). FIG. 22B illustrates voltage signals at various nodes of the analog drive circuit of FIG. 22A in the reset mode. As described above, the analog drive circuit may be fabricated in an IGZO layer or another suitable material layer. In the illustrated example, the analog drive circuit may include a 4T1C structure that includes four transistors M0 (2210), M1 (2220), M2 (2230), and M3 (2240), and a capacitor C0 (2250) that is used as the analog storage device. Transistor M0 (2210) may be used to provide a drive current to micro-LED 2260, and transistors M1 (2220), M2 (2230), and M3 (2240) may be used to set the analog voltage at the gate of transistor M0 (2210).

In the reset mode shown in FIGS. 22A and 22B, a VDD-enable signal ("vdden" signal 2202) is set to a high level to turn on transistors M1 (2220), and a write-enable signal ("wren" signal 2204) may be set to a high level to turn on M2 (2230). Therefore, the gate of transistor M0 (2210) may be charged to about VDD via transistors M1 (2220) and M2 (2230). A cathode voltage signal $V_{CAT}$ (2208) at the cathode of micro-LED 2260 may be set to a high level, and thus micro-LED 2260 may not be turned on to emit light. When "wren" signal 2204 is set to a high level, transistor M3 (2240) may be turned on and the source of transistor M0 (2210) may be set to analog data Vin (2206) via transistor M3 (2240).

Figure 23B:
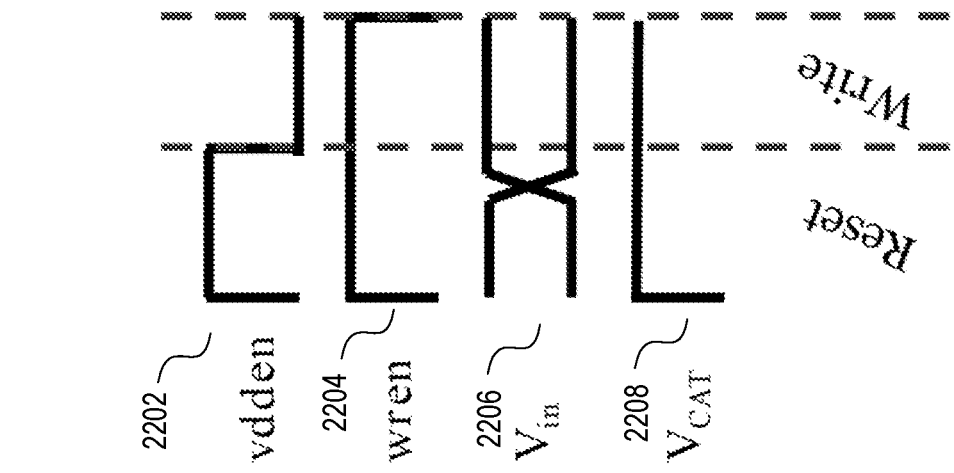
FIG. 23B illustrates examples of voltage signals at various nodes of the analog drive circuit of FIG. 22A in the write mode.
Figure 23A:
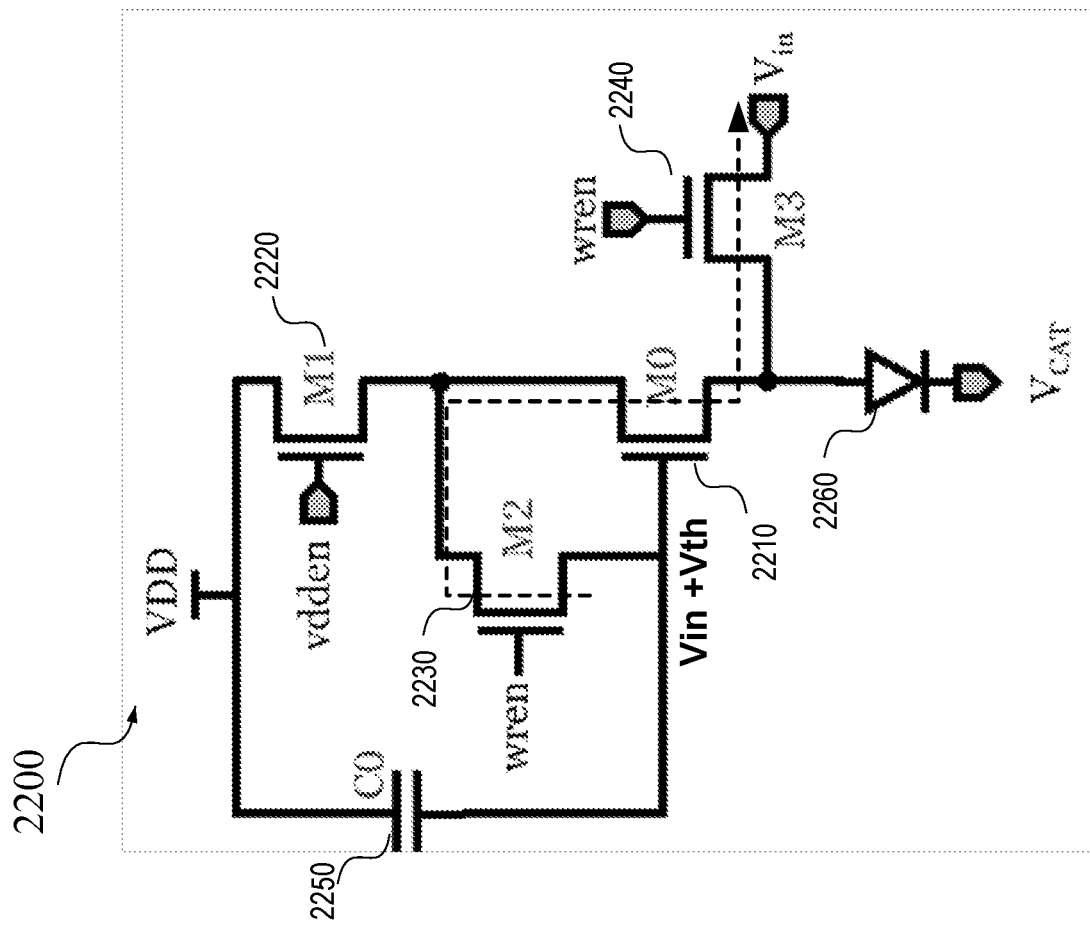
FIG. 23A illustrates the example of the analog drive circuit of FIG. 22A in a write mode.

FIG. 23A illustrates the example of the analog drive circuit of FIG. 22A in a write mode. FIG. 23B illustrates examples of voltage signals at various nodes of the analog drive circuit of FIG. 22A in the write mode. As shown in FIGS. 23A and 23B, in the write mode, "vdden" signal 2202 is set to a low level, and "wren" signal 2204 and cathode voltage signal $V_{CAT}$ at the cathode of micro-LED 2260 remain high. Therefore, transistor M1 (2220) may be turned off, and transistors M0 (2210), M2 (2230), and M3 (2240) may be turned on. As such, the source of transistor M0 (2210) may be at a voltage level yin, the gate of transistor M0 (2210) may be discharged to $V_{in}+V_{th}$ via transistors M2 (2230), M0 (2210), and M3 (2240), where $V_{th}$ is the threshold voltage of transistor M0 (2210). A voltage signal VDD− ($V_{in}+V_{th}$) may thus be stored at capacitor C0 (2250). Due to the low leakage of the analog circuits in the IGZO layer, the voltage level at the gate of transistor M0 (2210) may remain at about $V_{in}+V_{th}$. Because the voltage signal $V_{CAT}$ (2208) at the cathode of micro-LED 2260 is high, micro-LED 2260 may not be turned on to emit light.

Figures 24A, 24B:
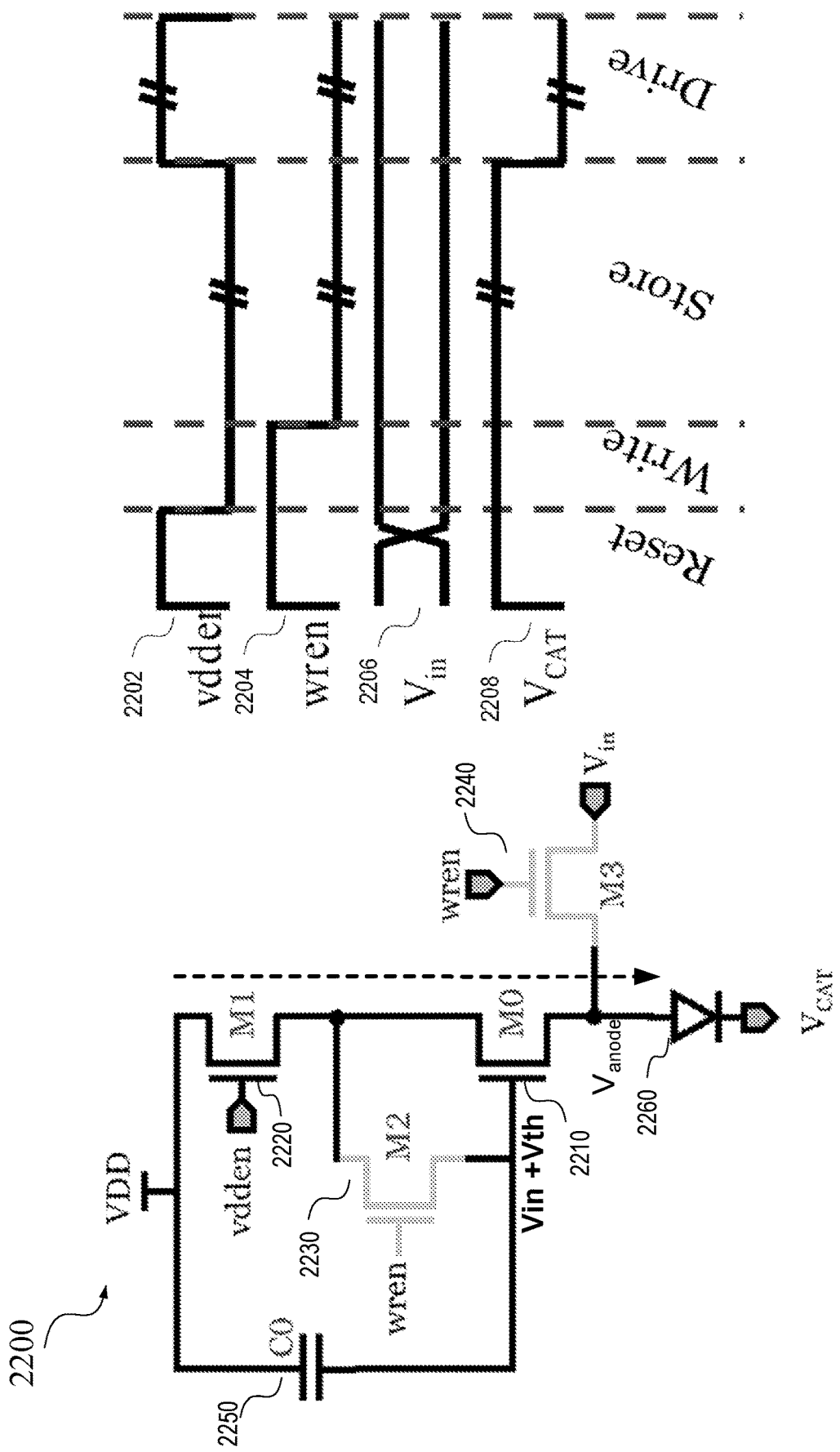
FIG. 24A illustrates the example of the analog drive circuit of FIG. 22A in a drive mode.
FIG. 24B illustrates examples of voltage signals at various nodes of the analog drive circuit of FIG. 22A in a drive mode.

FIG. 24A illustrates the example of the analog drive circuit of FIG. 22A in a drive mode to drive micro-LED 2260 using the voltage signal stored in capacitor C0 (2250) or at the gate of transistor M0 (2210). FIG. 24B illustrates examples of voltage signals at various nodes of the analog drive circuit of FIG. 22A in a drive mode. As shown in FIGS. 24A and 24B, in the drive mode, "vdden" signal (2202) is set to a high level to turn on transistor M1 (2220), "wren" signal 2204 is at a low level and thus transistors M2 (2230) and M3 (2240) are turned off, the gate of transistor M0 (2210) remains at a level $V_{in}+V_{th}$, and voltage signal $V_{CAT}$ (2208) at the cathode of micro-LED 2260 is at a low level. Therefore, transistor M0 (2210) may be turned on, where the gate-source voltage $V_{GS}$ of transistor M0 may be about $V_{GS}=V_{in}+V_{th}-V_{anode}$, and $V_{anode}$ is the voltage level at the anode of micro-LED 2260. As such, a current may flow through transistor M1 (2220) and transistor M0 (2210) to micro-LED 2260 when "vdden" signal 2202 is set to a high level and voltage signal $V_{CAT}$ (2208) is set to a low level.

As described above with respect to FIG. 21, when the current driving transistor M0 (2210) operates in the saturation region, the LED drive current $I_{\mu LED}$ that flows through transistor M0 (2210) and micro-LED 2260 may be approximately determined according to:

$$I_{\mu LED} = \frac{W\mu C_{ox}}{2L}(V_{GS} - V_{th})^2.$$

Since the gate-source voltage $V_{GS}$ of transistor M0 is about $V_{GS}=V_{in}+V_{th}-V_{anode}$, the LED drive current $I_{\mu LED}$ may be:

$$I_{\mu LED} = \frac{W\mu C_{ox}}{2L}(V_{in} + V_{th} - V_{anode} - V_{th})^2, \text{ or}$$

$$I_{\mu LED} = \frac{W\mu C_{ox}}{2L}(V_{in} - V_{anode})^2,$$

which is not a function of the threshold voltage $V_{th}$ of transistor M0 (2210). In a steady state, $I_{\mu LED}$ may remain constant and $V_{anode}$ may also remain constant. Since $I_{\mu LED}$ is not a function of the threshold voltage $V_{th}$ of transistor M0 (2210), the variations in threshold voltage $V_{th}$ of transistor M0 (2210) may not affect the drive current of micro-LED 2260.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 25:
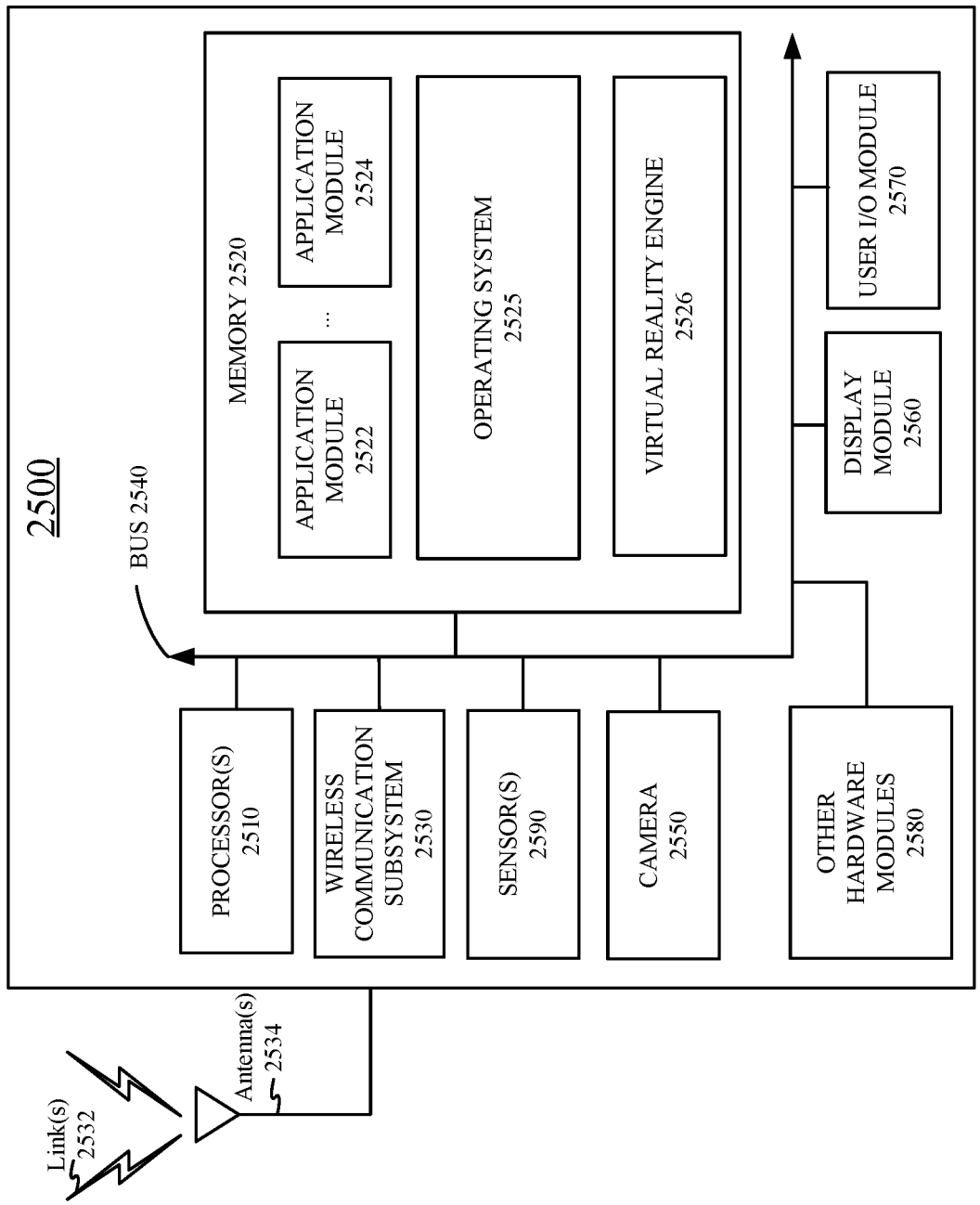
FIG. 25 is a simplified block diagram of an electronic system of an example of a near-eye display according to certain embodiments.

FIG. 25 is a simplified block diagram of an example electronic system 2500 of an example near-eye display (e.g., HMD device) for implementing some of the examples disclosed herein. Electronic system 2500 may be used as the electronic system of an HMD device or other near-eye displays described above. In this example, electronic system 2500 may include one or more processor(s) 2510 and a memory 2520. Processor(s) 2510 may be configured to execute instructions for performing operations at a number of components, and can be, for example, a general-purpose processor or microprocessor suitable for implementation within a portable electronic device. Processor(s) 2510 may be communicatively coupled with a plurality of components within electronic system 2500. To realize this communicative coupling, processor(s) 2510 may communicate with the other illustrated components across a bus 2540. Bus 2540 may be any subsystem adapted to transfer data within electronic system 2500. Bus 2540 may include a plurality of computer buses and additional circuitry to transfer data.

Memory 2520 may be coupled to processor(s) 2510. In some embodiments, memory 2520 may offer both short-term and long-term storage and may be divided into several units. Memory 2520 may be volatile, such as static random access memory (SRAM) and/or dynamic random access memory (DRAM) and/or non-volatile, such as read-only memory (ROM), flash memory, and the like. Furthermore, memory 2520 may include removable storage devices, such as secure digital (SD) cards. Memory 2520 may provide storage of computer-readable instructions, data structures, program modules, and other data for electronic system 2500. In some embodiments, memory 2520 may be distributed into different hardware modules. A set of instructions and/or code might be stored on memory 2520. The instructions might take the form of executable code that may be executable by electronic system 2500, and/or might take the form of source and/or installable code, which, upon compilation and/or installation on electronic system 2500 (e.g., using any of a variety of generally available compilers, installation programs, compression/decompression utilities, etc.), may take the form of executable code.

In some embodiments, memory 2520 may store a plurality of application modules 2522 through 2524, which may include any number of applications. Examples of applications may include gaming applications, conferencing applications, video playback applications, or other suitable applications. The applications may include a depth sensing function or eye tracking function. Application modules 2522-2524 may include particular instructions to be executed by processor(s) 2510. In some embodiments, certain applications or parts of application modules 2522-2524 may be executable by other hardware modules 2580. In certain embodiments, memory 2520 may additionally include secure memory, which may include additional security controls to prevent copying or other unauthorized access to secure information.

In some embodiments, memory 2520 may include an operating system 2525 loaded therein. Operating system 2525 may be operable to initiate the execution of the instructions provided by application modules 2522-2524 and/or manage other hardware modules 2580 as well as interfaces with a wireless communication subsystem 2530 which may include one or more wireless transceivers. Operating system 2525 may be adapted to perform other operations across the components of electronic system 2500 including threading, resource management, data storage control and other similar functionality.

Wireless communication subsystem 2530 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2500 may include one or more antennas 2534 for wireless communication as part of wireless communication subsystem 2530 or as a separate component coupled to any portion of the system. Depending on desired functionality, wireless communication subsystem 2530 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2530 may permit data to be exchanged with a network, other computer systems, and/or any other devices described herein. Wireless communication subsystem 2530 may include a means for transmitting or receiving data, such as identifiers of HMD devices, position data, a geographic map, a heat map, photos, or videos, using antenna(s) 2534 and wireless link(s) 2532. Wireless communication subsystem 2530, processor(s) 2510, and memory 2520 may together comprise at least a part of one or more of a means for performing some functions disclosed herein.

Embodiments of electronic system 2500 may also include one or more sensors 2590. Sensor(s) 2590 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2590 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2500 may include a display module 2560. Display module 2560 may be a near-eye display, and may graphically present information, such as images, videos, and various instructions, from electronic system 2500 to a user. Such information may be derived from one or more application modules 2522-2524, virtual reality engine 2526, one or more other hardware modules 2580, a combination thereof, or any other suitable means for resolving graphical content for the user (e.g., by operating system 2525). Display module 2560 may use LCD technology, LED technology (including, for example, OLED, ILED, µ-LED, AMO-LED, TOLED, etc.), light emitting polymer display (LPD) technology, or some other display technology.

Electronic system 2500 may include a user input/output module 2570. User input/output module 2570 may allow a user to send action requests to electronic system 2500. An action request may be a request to perform a particular action. For example, an action request may be to start or end an application or to perform a particular action within the application. User input/output module 2570 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2500. In some embodiments, user input/output module 2570 may provide haptic feedback to the user in accordance with instructions received from electronic system 2500. For example, the haptic feedback may be provided when an action request is received or has been performed.

Electronic system 2500 may include a camera 2550 that may be used to take photos or videos of a user, for example, for tracking the user's eye position. Camera 2550 may also be used to take photos or videos of the environment, for example, for VR, AR, or MR applications. Camera 2550 may include, for example, a complementary metal-oxide-semiconductor (CMOS) image sensor with a few millions or tens of millions of pixels. In some implementations, camera 2550 may include two or more cameras that may be used to capture 3-D images.

In some embodiments, electronic system 2500 may include a plurality of other hardware modules 2580. Each of other hardware modules 2580 may be a physical module within electronic system 2500. While each of other hardware modules 2580 may be permanently configured as a structure, some of other hardware modules 2580 may be temporarily configured to perform specific functions or temporarily activated. Examples of other hardware modules 2580 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2580 may be implemented in software.

In some embodiments, memory 2520 of electronic system 2500 may also store a virtual reality engine 2526. Virtual reality engine 2526 may execute applications within electronic system 2500 and receive position information, acceleration information, velocity information, predicted future positions, or any combination thereof of the HMD device from the various sensors. In some embodiments, the information received by virtual reality engine 2526 may be used for producing a signal (e.g., display instructions) to display module 2560. For example, if the received information indicates that the user has looked to the left, virtual reality engine 2526 may generate content for the HMD device that mirrors the user's movement in a virtual environment. Additionally, virtual reality engine 2526 may perform an action within an application in response to an action request received from user input/output module 2570 and provide feedback to the user. The provided feedback may be visual, audible, or haptic feedback. In some implementations, processor(s) 2510 may include one or more GPUs that may execute virtual reality engine 2526.

In various implementations, the above-described hardware and modules may be implemented on a single device or on multiple devices that can communicate with one another using wired or wireless connections. For example, in some implementations, some components or modules, such as GPUs, virtual reality engine 2526, and applications (e.g., tracking application), may be implemented on a console separate from the head-mounted display device. In some implementations, one console may be connected to or support more than one HMD.

In alternative configurations, different and/or additional components may be included in electronic system 2500. Similarly, functionality of one or more of the components can be distributed among the components in a manner different from the manner described above. For example, in some embodiments, electronic system 2500 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and C, such as AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A display device comprising:
   a silicon wafer including digital circuits, the digital circuits characterized by a first operating supply voltage and configured to generate digital control signals based on digital display data of an image frame;
   a micro-light emitting diode (micro-LED) wafer including an array of micro-LEDs; and
   an indium-gallium-zinc-oxide (IGZO) layer between the silicon wafer and the micro-LED wafer and including analog circuits, the analog circuits characterized by a second operating supply voltage higher than the first operating supply voltage, wherein the analog circuits include:
      analog storage devices configured to storing analog signals; and
      transistors controlled by the digital control signals and the analog signals to generate drive currents for driving the array of micro-LEDs,
   wherein the digital circuits on the silicon wafer or the analog circuits in the IGZO layer include level-shifting circuits at interfaces between the digital circuits and the analog circuits.

2. The display device of claim 1, wherein the digital circuits include, for each micro-LED in the array of micro-LEDs:
   memory cells configured to store digital display data for the micro-LED;
   a pulse-width modulation (PWM) latch configured to generate PWM signals for modulating a respective drive current of the drive currents; and
   a comparator configured to compare the digital display data for the micro-LED with a counter value and generate a digital control signal of the digital control signals at an output port of the comparator.

3. The display device of claim 2, wherein the level-shifting circuits include an inverter between the output port of the comparator and a gate of a transistor of the transistors in the analog circuits.

4. The display device of claim 1, wherein the analog signals include analog calibration signals for achieving an uniform intensity among the array of micro-LEDs.

5. The display device of claim 4, wherein the digital circuits include a memory device configured to store analog calibration data for generating the analog calibration signals.

6. The display device of claim 1, wherein the analog storage devices are configured to preserve the analog signals for more than one image frame period after the analog signals are loaded into the analog storage devices.

7. The display device of claim 1, wherein the analog signals include analog voltage levels corresponding to one-bit or multi-bit display data of the image frame.

8. The display device of claim 1, wherein the analog circuits include, for each micro-LED of the array of micro-LEDs:

a capacitor configured to store an analog signal of the analog signals;

a set of transistors configured to generate, based on the analog signal, a drive current for driving the micro-LED; and a switch connecting the micro-LED to the set of transistors, wherein the switch is configured to selectively supply the drive current to the micro-LED based on a digital control signal of the digital control signals generated by the digital circuits.

9. The display device of claim 8, wherein the switches for micro-LEDs in a row of the array of micro-LEDs are controlled by a common pre-charge transistor that is configured to turn on the micro-LEDs in the row of the array of micro-LEDs at a beginning of an image frame.

10. The display device of claim 8, wherein:

the switch for each micro-LED of micro-LEDs in a row of the array of micro-LEDs is controlled by a respective pre-charge transistor; and the pre-charge transistors for the micro-LEDs in the row of the array of micro-LEDs are configured to receive a common control signal such that the switches for the micro-LEDs in the row of the array of micro-LEDs are switched at a same time at a beginning of an image frame to turn on the micro-LEDs in the row of the array of micro-LEDs.

11. The display device of claim 10, wherein the analog circuits include, for each micro-LED of the array of micro-LEDs, a circuit configured to disconnect the respective pre-charge transistor from a power supply.

12. The display device of claim 8, wherein the capacitor and the set of transistors form a 2T1C drive circuit.

13. The display device of claim 8, wherein:

the capacitor and the set of transistors form a 4T1C drive circuit; and the 4T1C drive circuit is configured such that the drive current is independent of a threshold voltage of a transistor of the set of transistors that generates the drive current.

14. The display device of claim 8, wherein:

the switch includes a switch transistor;

the analog circuits further comprise a pull-down transistor;

a gate of the pull-down transistor is electrically connected to the digital circuits to receive the digital control signal; and a drain or source of the pull-down transistor is electrically connected to a gate of the switch transistor.

15. The display device of claim 1, wherein the digital circuits comprise test circuits for calibrating the array of micro-LEDs.

16. The display device of claim 1, wherein the transistors comprise thin-film transistors.

17. The display device of claim 1, wherein a pitch of the array of micro-LEDs is equal to or less than 3 μm.

18. The display device of claim 1, wherein the digital circuits include at least 8 memory cells for storing digital display data for each micro-LED in the array of micro-LEDs.

19. The display device of claim 1, wherein the IGZO layer is bonded to the silicon wafer via a plurality of metal bumps or metal bonding pads.

20. The display device of claim 1, wherein the IGZO layer is deposited on the micro-LED wafer or bonded to the micro-LED wafer.

\* \* \* \* \*